United States Patent
Takenaka et al.

(10) Patent No.: US 7,283,130 B2
(45) Date of Patent: Oct. 16, 2007

(54) DISPLAY DEVICE

(75) Inventors: Yuuichi Takenaka, Mobara (JP);
Takanori Nakayama, Mobara (JP)

(73) Assignee: Hitachi Displays, Ltd., Mobara-Shi (JP)

( * ) Notice: Subject to any disclaimer, the term of this patent is extended or adjusted under 35 U.S.C. 154(b) by 610 days.

(21) Appl. No.: 10/917,293

(22) Filed: Aug. 13, 2004

(65) Prior Publication Data
US 2005/0052442 A1 Mar. 10, 2005

(30) Foreign Application Priority Data
Aug. 18, 2003 (JP) ............... 2003-294089

(51) Int. Cl.
G09G 5/00 (2006.01)
G06F 3/038 (2006.01)
(52) U.S. Cl. .............. 345/206; 349/152; 361/789
(58) Field of Classification Search ......... 345/50, 345/55, 204, 206, 87; 349/149, 151, 152; 361/749, 750, 789
See application file for complete search history.

(56) References Cited
U.S. PATENT DOCUMENTS
6,664,942 B1 * 12/2003 Kim et al. ............. 345/206
7,002,809 B2 * 2/2006 Lee ........................ 361/789
7,119,801 B1 * 10/2006 Endo et al. ............. 345/87

* cited by examiner

*Primary Examiner*—Kevin M. Nguyen
(74) *Attorney, Agent, or Firm*—Antonelli, Terry, Stout & Kraus, LLP.

(57) ABSTRACT

To prevent the peeling-off of a drive circuit chip from an insulation substrate of a display device attributed to a residual stress between terminals formed on the insulation substrate and bumps formed on a mounting surface of a drive circuit chip, as well as to stabilize the connection resistance therebetween, the present invention provides an auxiliary bump for one of the bumps on the mounting surface of the drive circuit chip at an end edge side thereof with respect to the one of the bumps and arranges the auxiliary bump electrically in contact with one of the terminals formed on the insulation substrate of the display device with which the one of the bumps also is in electrical contact. Since the one of the bumps is spaced from the end edge side of the mounting surface of the drive circuit chip by the auxiliary bump, electrical contact thereof with the one of the terminals cannot be affected by the atmosphere, in which the display device is used, and distortion of a signal waveform caused thereat can be suppressed also.

10 Claims, 11 Drawing Sheets

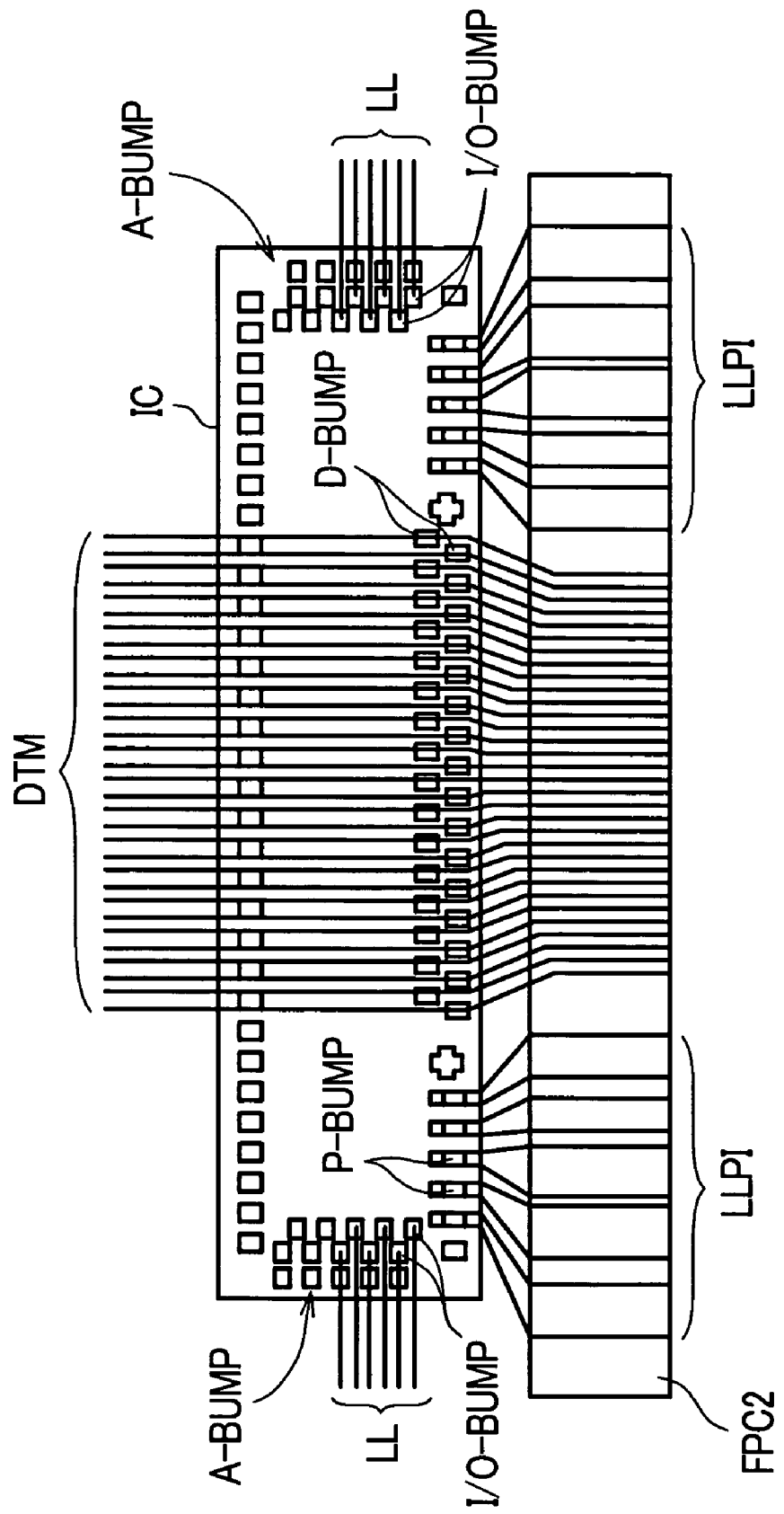

DISPLAY DEVICE

The present application claims priority from Japanese application JP 2003-294089 filed on Aug. 18, 2003, the content of which is hereby incorporated by reference into this application.

BACKGROUND OF THE INVENTION

The present invention relates to the drive circuit chip mounting structure for use in a display device, and, more particularly, to a so-called flip-chip mounting type (or a chip-on-glass type) display device in which drive circuit chips are directly mounted on the periphery of a substrate which constitutes a display panel of the display device.

An active matrix type display device, which includes active elements, such as thin film transistors, for respective pixels and performs a switching driving of these active elements, is a known type of panel type display device, and it is exemplified by a liquid crystal display device or an organic EL display device. The present invention is characterized by the mounting structure of the drive circuit chips on a display panel which is applied to this type of panel type display device. Since the mounting structure of the drive circuit chips is substantially the same among the different panel type display devices, such as a liquid crystal display device and an organic EL display device, the mounting structure of the drive circuit chips will be explained hereinafter using a liquid crystal display device which employs a liquid crystal panel as an example.

For example, as an active matrix type liquid crystal display device which uses thin film transistors as active elements, a display device which adopts the mounting method which is referred to as a so-called flip-chip mounting method (FCA method) or a chip-on-glass mounting method (COG method) has been known, and such a display device has the following constitution. That is, a liquid crystal layer is sealed between a pair of insulation substrates, which are preferably made of glass plate, and a large number of pixels are arranged in a matrix array formed on a display region thereof. Further, input/output wiring lines for supplying display signals and voltages for displaying images to the pixels are formed on the outside of the display region on one insulation substrate. At least one drive circuit chip is directly mounted along a periphery of the insulation substrate and is connected with the terminal portions of the above-mentioned input/output wiring lines by way of an anisotropic conductive film having adhesiveness.

In such an active matrix type liquid crystal display device, a liquid crystal drive voltage (a gray scale voltage) is applied to pixel electrodes by way of the thin film transistors, and, hence, there is no crosstalk between the respective pixels. Accordingly, the active matrix type liquid crystal display device can produce a multi-gray-scale display without using a particular drive method for preventing crosstalk, which is different from the simple matrix type display device.

FIG. 11 is a plan view which schematically illustrates an example of the arrangement and structure of the periphery of the drive circuit chip mounted on the end periphery of one substrate of the liquid crystal display panel. Further, FIG. 12 is a plan view showing a state in which a flexible printed circuit board is mounted on the drive circuit power source inputting lines shown in FIG. 11. In FIG. 11 and FIG. 12, the drive circuit chip IC, which is mounted on the outside of the display region of one insulation substrate, has projecting terminals (hereinafter referred to as bumps) on a mounting surface (a surface which faces a main surface of the insulation substrate, also referred to as a circuit surface or a front-side surface) thereof. These bumps are connected with line terminals which are formed on the main surface of the insulation substrate. In FIG. 11 and FIG. 12, theses bumps are indicated by squares. The insulation substrate is provided with input/output wiring lines LL which supply drive signals and voltages from an external signal source to input/output bumps I/O-BUMP formed on a short side of the drive circuit chip IC with respect to one of a plurality of drive circuit chips IC and which sequentially transfer the drive signals and voltages to another one of the plurality of drive circuit chips IC arranged close to the drive circuit chip (drive circuit chips IC positioned next to the above-mentioned one drive circuit chip IC). Terminal portions which are electrically connected with the bumps are formed on one end of the respective wiring lines, for example.

Further, on one of the long sides (end periphery sides of the insulation substrate) of the drive circuit chip IC, data output bumps D-BUMP, which are connected with data wiring lines (drain-line lead lines) DTM that extend on the insulation substrate from the display region, and power source input bumps P-BUMP, which are connected with the drive circuit power source input wiring lines LLP, are formed. Here, among these bumps, dummy bumps are included for averaging the mounting gap between the drive circuit chip IC and the insulation substrate. In the drawing, a bold crucifix symbol represents an alignment mark for positioning at the time of mounting.

The drive circuit chip IC is mounted on the main surface of the insulation substrate by aligning the positions of the plurality of bumps formed on the mounting surface thereof and the positions of the plurality of wiring lines (input/output wiring lines) formed on the main surface of the insulation substrate corresponding to the plurality of bumps; and, thereafter, it is adhered to the insulation substrate by thermo-compression bonding the plurality of bumps and the plurality of wiring lines by way of an anisotropic conductive film. Such a mounting method is referred to above as the flip-chip method (FCA method) or the chip-on-glass method (COG method). Further, a flexible printed circuit board FPC2 also has the wiring lines thereof fixed to the drive circuit power source input wiring lines LLP by thermo compression bonding in the same manner using the anisotropic conductive film. Hereinafter, the term "chip on glass mounting method (COG method) will be used.

Here, with respect to a liquid crystal display device which mounts a drive circuit chip on an insulation substrate using the COG method, reference is made to Patent Document 1. The Patent Document 1 describes a technique in which dummy bumps are formed on four corners of a drive circuit chip so as to enable confirmation of the positioning and the compression-bonded state by the naked eye at the time of mounting.

[Patent Document 1]
  JP-A-11-125837

SUMMARY OF THE INVENTION

In mounting a drive circuit chip using the COG method, a phenomenon, in which the connection resistance between the bumps formed at four corners of the drive circuit chip IC and the input/output wiring line terminals formed on the insulation substrate is increased or the resistance value becomes unstable, is liable to be easily generated. Such a phenomenon is attributed to stress (residual stress) remaining in the compression-bonded surface after thermo-compression bonding the drive circuit chip.

FIG. 13 is a graph showing the residual stress on the compression-bonded surface of the mounted drive circuit chip and the distribution of the residual stress in the direction from the center of the drive circuit chip shown in FIG. 11 (expressed as the center of driver in FIG. 11) to the outer edge of the short side of the drive circuit chip IC (expressed as outer edge of driver in FIG. 11). The residual stress depends on the distance from the center of the drive circuit chip IC, as shown in FIG. 11, and assumes the maximum value at the outer edge of the short side of the drive circuit chip IC.

Further, as shown in FIG. 12, when the flexible printed circuit board FPC2 is thermo-compression bonded to the vicinity of the drive circuit chip IC using the anisotropic conductive film, heat generated at the time of thermo compression bonding flows in the drive circuit chip IC, as indicated by an arrow, and, hence, an adhesive surface between the anisotropic conductive film filled between the mounting surface of the drive circuit chip IC and the insulation substrate and the insulation substrate is subjected to damage. This damage depends on the residual stress and the inflow heat value. Accordingly, there exists a possibility that the connection resistance between the bumps and the wiring line terminal portions which interpose the anisotropic conductive film therebetween in the vicinities of the two corners of the drive circuit chip IC close to the flexible printed circuit board FPC2 becomes high and unstable. As a result, images displayed on the display region suffer from a defective display. This defective display becomes more apparent when the heat conduction in the vicinities of the corner portions of the drive circuit chip IC is favorable compared to the heat conduction at the center portion of the drive circuit chip IC. Such a drawback constitutes a task to be solved by the present invention. Such a drawback is not limited to a liquid crystal display device and occurs also with respect to a display device which uses a similar drive circuit chip.

Accordingly, it is an object of the present invention to overcome the above-mentioned drawbacks and to provide a highly reliable display device which can produce a high-quality image display by obviating the generation of high resistance between wiring lines or wiring line terminal portions which are formed on an insulation substrate which constitutes a display device and bumps provided to a drive circuit chip, thus stabilizing the connection resistance and preventing the generation of a defective display.

In a display device which includes (1) an insulation substrate, (2) a display region which is formed by arranging a plurality of pixels on a main surface of the insulation substrate, (3) at least one drive circuit element (drive circuit chip) which is mounted on a peripheral portion along the main surface of the insulation substrate and supplies signals or electric power to the display region, and (4) a plurality of wiring lines which are formed on the peripheral portion of the main surface and have terminal portions thereof which are connected to the drive circuit element respectively formed on a mounting portion of the main surface on which the drive circuit element is mounted and which respectively extend from the terminal portions to the outside of the portion of the main surface which is covered with the drive circuit element (the portion where the terminal portions are formed), wherein (5) the terminal portions which are respectively provided to the plurality of wiring lines are arranged in parallel along one end of the mounting portion such that the plurality of terminal portions are arranged close to one end of the mounting portion by every one other, and (6) a plurality of bumps which are connected to the respective terminal portions by an anisotropic conductive film are arranged in parallel on a mounting surface of the drive circuit element which faces the mounting portion of the main surface in an opposed manner along one side of the mounting surface which faces one end of the mounting portion in an opposed manner, the present invention introduces the following structures.

Structure 1 First bumps which belong to the plurality of bumps and are respectively connected to a group of terminal portions that are provided close to one end of the mounting portion are arranged closer to one side of the mounting surface than the plurality of respective bumps other than the first bumps. Further, second bumps which are different from the plurality of bumps are formed on the mounting surface close to the first bumps at one side of the mounting surface. When the plurality of bumps are input bumps which input signals or electric power to the drive circuit elements, the second bumps are provided as additional bumps which are added to the input side (an end portion of the one side of the mounting surface) of the drive circuit element where the input bumps are arranged in parallel. Here, on the main surface of the insulation substrate, the peripheral portion is positioned outside the display region and corresponds to a region which defines a "picture frame" with respect to the screen of the display device.

Structure 2 In the above-mentioned structure 1, the second bumps assume the same potential as the first bumps which are arranged close to the second bumps. For example, in the above-mentioned drive circuit element, the first bumps and the second bumps, which are arranged close to the first bumps at one side of the mounting surface, are made to become conductive with each other.

Structure 3 In the above-mentioned structure 1 or structure 2, one of the terminal portions which are connected to the first bumps has an area with which not only the first bump but also the second bump, which is arranged close to the first bump, are brought into contact.

Structure 4 In the above-mentioned structure 1 or structure 2, the second bumps are arranged to face the wiring lines which are connected to the first bumps close to the second bumps and are spaced apart from the first bumps.

In the above-mentioned structure 3, an area of one terminal portion which is connected to the first bump and the second bump that is arranged close to the first bump is larger than an area of another terminal portion which is formed on another wiring line that is arranged close to one of the wiring lines which are electrically connected with the first bumps.

In the above-mentioned structure 2, the plurality of wiring lines are covered with an insulation film, and the terminal portions are brought into contact with the wiring lines through openings which are formed on the insulation film and expose the respective lines and extend over the insulation film. Further, the second bumps may face the wiring lines which are connected with the first bumps arranged close to the second bumps by way of the insulation film. Still further, the second bumps may be spaced apart from the first bumps.

Structure 5 In the above-mentioned structure 1, in place of providing the second bumps close to the first bumps at one side of the mounting surface thereof separately from the plurality of bumps, the first bumps are extended to one side of the mounting surface. When the first bumps are set as respective bumps which belong to one group out of the plurality of groups, the bumps of this one group are extended more to the one side of the mounting surface than the bumps which belong to other groups out of the plurality of groups. The bumps which belong to the other group are respectively compression-bonded to the other group of terminal portions out of the plurality of terminal portions which are formed inside the mounting portion of the main surface of the insulation substrate than the one group of terminal portions out of the plurality of terminal portions to which the first bumps are compression-bonded. In the structure 5, the length of the bumps of the one group (the first bumps) which extend to the one side of the mounting surface may be twice or more than the length of the bumps of the other group (in other words, the length which the first bumps are required to satisfy originally).

Here, in the above-mentioned structures, the plurality of drive circuit elements may be mounted in parallel along one side of the main surface of the insulation substrate or the bumps which are formed on the pair of neighboring drive circuit elements out of the plurality of drive circuit elements may be connected to each other by the plurality of wiring lines.

According to the display device which is characterized by the structure 1, the distance between the first bump which is arranged close to one end of the drive circuit element (for example, the input side of signals or electric power to the drive circuit side) on the mounting surface of the drive circuit element (chip) and one end becomes longer than the second bumps, and, hence, in a step for connecting the first bumps to the terminal portions formed on the main surface of the insulation substrate by the anisotropic conductive film and succeeding steps, the stress applied to the connecting surface between the first bumps and the terminal portions can be attenuated. After thermo-compression bonding the first bumps and the terminal portions using the anisotropic conductive film, along with the lowering of the temperature of the anisotropic conductive film which is sandwiched between the first bumps and the terminal portions, a shearing stress in the direction along the main surface of the insulation substrate is applied to the anisotropic conductive film. This shearing stress becomes a cause of peeling off of the anisotropic conductive film which is sandwiched between the area from the first bumps and the terminal portions from the first bumps or the terminal portions, and this drawback becomes more apparent according to an exponential function as the position of the bump to be thermo-compression-bonded approaches the end portion of the drive circuit element (chip).

Accordingly, even by providing the second bumps at the end portion (one side of the mounting surface) of the drive circuit element, the reliability of electric connection between the first bumps arranged at the end portion side of the drive circuit element and the terminal portions which face the first bump portions in an opposed manner is enhanced.

An advantage of such structure can be obtained even with respect to the display device in which the above-mentioned structure 5 in which the first bumps arranged at the end portion side of the drive circuit element extend to the end portion side. By setting the length of the first bump toward the end portion (one side of the mounting surface) of the drive circuit element to be longer than the other bump which is provided at the end portion side of the drive circuit element and is more remote from the end portion than the first bump, the bonding area between the first bump and the terminal portion is more greatly expanded than the bonding area between the other bump and the corresponding terminal portion. Accordingly, the anisotropic conductive film which is sandwiched between the first bumps and the terminal portions can, even when a portion thereof (end portion side of the drive circuit element) receives the drawback of stress, obviate the drawback caused by the stress using the remaining portion thereof, and, hence, a favorable electric connection between the first bumps and the terminal portions can be maintained. Here, the length of the first bump in the direction toward one side of the mounting surface becomes, when the drive circuit element is mounted on the main surface of the insulation substrate, the length along the direction which extends from the inside of the mounting portion of the main surface to one end of the mounting portion which opposes one side of the mounting surface.

In both the display device in which the above-mentioned structure 1 is introduced and the display device in which the above-mentioned structure 5 is introduced, it is possible to obtain the following advantageous effects besides the above-mentioned advantageous effects.

The first advantageous effect lies in the reduction of the power loss and the delay or the strain of signals at a bonding portion of the first bump of the drive circuit element and the terminal portion formed on the main surface of the insulation substrate using the anisotropic conductive film. The advantageous effect can be obtained due to the reduction of the electric resistance between the first bump and the terminal portion via the bonding portion. As the bonding portion between the first bump and the terminal portion becomes spaced further away from one side of the mounting surface of the drive circuit element, the bonding portion is more surely isolated from the atmosphere in which the display device is used due to the main surface of the insulation substrate, the mounting surface of the drive circuit element which faces the insulation substrate and the anisotropic conductive film, and, hence, the electric resistance between the first bump and the terminal portion can be maintained at a low level in a stable manner for a long period.

Another advantage lies in the fact that, in a step in which, in a state where the mounting surface of the drive circuit element is arranged to face the anisotropic conductive film which is formed on the peripheral portion of the main surface of the insulation substrate (including the mounting portion of the main surface), the thermo-compression bonding head is brought into contact with an upper surface (side opposite to the mounting surface) of the drive circuit element so as to bond the bumps (respective bumps including the above-mentioned first bumps) formed on the mounting surface of the drive circuit element and terminal portions formed on the peripheral portion of the main surface of the insulation substrate, no residual stress is applied to the anisotropic conductive film which is sandwiched between the first bumps and the terminal portions so as to bond them and, at the same time, the reliability of bonding between first bumps and the terminal portions is not damaged. Since the first bumps are positioned inside the mounting surface of the drive circuit element (being remote from one side of the mounting surface), in this bonding step, the influence that the inclination of the thermo compression bonding head, which is brought into contact with the upper surface of the drive circuit element, with respect to the upper surface affects the bonding (thermo compression bonding) of the first bumps and the terminal portions can be reduced.

In the display device in which the structure 2 is introduced, the second bumps and the first bumps which are arranged close to the second bumps assume the same potential and, hence, the parasitic capacitance which is generated along the wiring lines which are connected to the first bumps can be reduced. Accordingly, the distortion of waveforms which are generated with signals which are transmitted through the wiring lines also can be suppressed. Even when the second bumps are brought into contact with the wiring lines which are connected with the first bumps that are arranged close to the second bumps, the second bumps and the first bumps may become conductive to each other or assume the same potential in the drive circuit element. On the other hand, when the second bumps face the wiring lines which are connected with the first bumps arranged close to the second bumps by way of an insulation film, no potential difference is substantially generated between an upper surface and a lower surface of the insulation film, and, hence, there is no possibility that the conductive film (particularly the metal film) which forms the wiring line will become fused due to electrolytic corrosion. Accordingly, the electric resistance of the wiring lines is maintained at a preferable low level. Further, compared to a case in which the second bumps face the wiring lines in an insulated manner and the second bump assumes a floating potential, the parasitic capacitance which is generated between the wiring lines and the second bumps can be held at a low level.

In the display device in which the structure 3 is introduced, by increasing the area of the terminal portion which is connected to the first bump to a size which also enables the bonding of the second bump which is arranged close to the first bump, in a step for mounting the drive circuit element on the main surface (the peripheral portion) of the insulation substrate, the accuracy of positioning of the plurality of terminal portions formed on the main surface of the insulation substrate and the plurality of bumps formed on the mounting surface of the drive circuit element can be enhanced. Accordingly, the plurality of bumps and the plurality of terminal portions can be favorably electrically connected with each other. Further, by combining the structure 3 and the structure 2, the electrical connection between the terminal portions and the second bump can be formed in parallel with respect to the electrical connection between the first bumps and the terminal portions corresponding to the first bumps, and, hence, it is possible to obtain the advantageous effect equivalent to the enlargement of the bonding area between the first bumps and the terminal portions. In other words, the conductive particles contained in the anisotropic conductive film can be increased, thus contributing the electrical connection between the first bumps and the terminal portions.

In the display device in which the above-mentioned structure 4 is introduced, due to the gap generated between the second bumps and the first bumps arranged close to the second bumps, the binder of the anisotropic conductive film which is fused during a step for bonding the first bumps to the terminal portions is efficiently discharged from a space sandwiched between the main surface of the insulation substrate and the mounting surface of the drive circuit element which faces the main surface of the insulation substrate in an opposed manner. Accordingly, the extra anisotropic conductive film and the conductive particles which are dispersed in the anisotropic conductive film as fillers hardly remain in the periphery of the bonding portion between the first bumps and the terminal portions, whereby the above-mentioned possibility that the stress applied to the bonding portion is increased can be eliminated.

Here, when the wiring lines include portions which extend obliquely with respect to one end of the mounting portion of the main surface of the insulation substrate, along with the decrease of an angle which the portion makes with the mounting portion, the distance between the wiring line and another wiring line arranged close to the wiring line becomes narrow. Accordingly, the second bump and the wiring line which is connected to the first bumps arranged close to the second bump may be configured, from a viewpoint of obviating the short-circuiting between the wiring lines and other neighboring wiring lines and the electric interference to other wiring lines due to the second bumps, such that these wiring lines face each other at portions thereof other than portions thereof which extend obliquely with respect to one end of the mounting portion of the main surface.

It is needless to say that the present invention is not limited to the features described in respective embodiments and various modifications are conceivable without departing from the technical concept of the present invention.

BRIEF DESCRIPTION OF THE DRAWINGS

FIG. 1 is a plan view showing an example of the arrangement and structure around a drive circuit chip of an embodiment of the invention mounted on an end edge of one substrate of a liquid crystal panel in an enlarged manner;

DETAILED DESCRIPTION

Figure 2A:
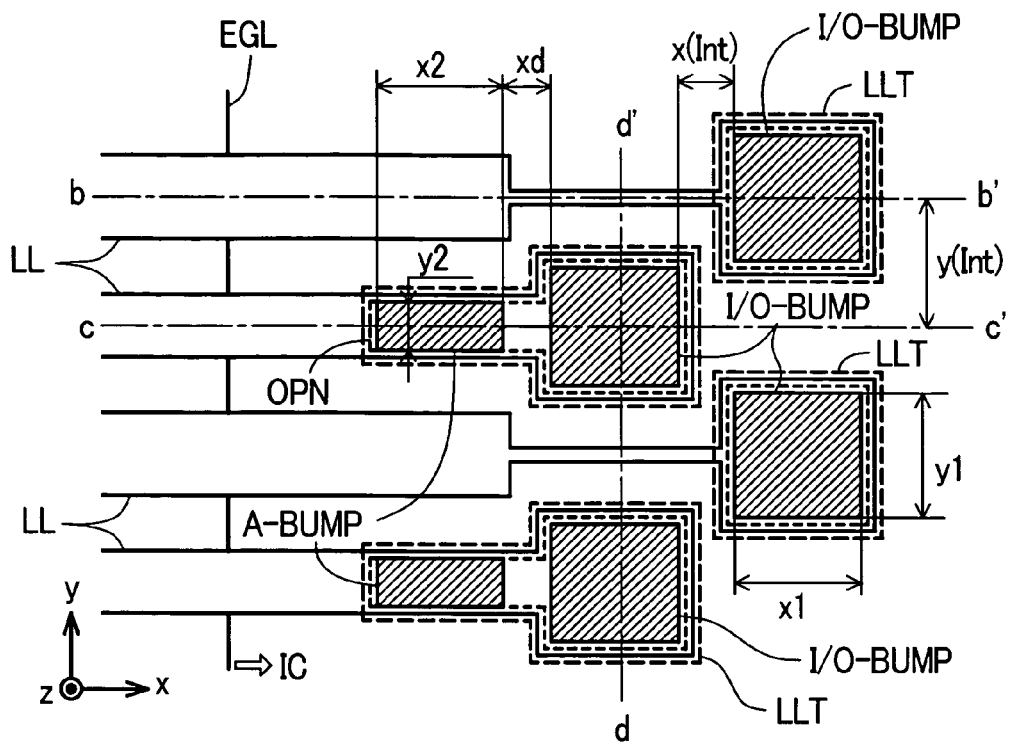
FIG. 2A is a plan view and FIGS. 2B to 2D are cross-sectional views taken along line b-b' c-c' and d-d', respectively, in FIG. 2A showing the planar structure of an embodiment 1 of the present invention in a state in which the left side of a drive circuit chip mounted on a main surface of an insulation substrate in FIG. 1 is partially enlarged.

Hereinafter, various embodiments of the display device according to the present invention will be explained in conjunction with the drawings.

EMBODIMENT 1

FIG. 1 is a plan view showing an example of the structure around a drive circuit chip (an integrated circuit element referred to as a drive circuit element) according to this embodiment, which drive circuit chip is mounted on an end periphery of a main surface of one substrate of a liquid crystal display panel, wherein the drawing shows a state in which a flexible printed circuit board is mounted on the wiring line for inputting drive circuit power. The drive circuit chip IC of this embodiment is used for driving drain lines which supply display data to drains of thin film transistors which constitute pixels. The drive circuit chip IC includes a plurality of first input/output bumps I/O-BUMP and a plurality of second input/output bumps A-BUMP on both short-sides of a mounting surface (a surface facing the insulation substrate, also referred to as a circuit surface or a front-side surface). Further, on one of the long sides which are positioned at an outer periphery of the insulation substrate, there are a plurality of data output bumps D-BUMP and a plurality of power source input bumps P-BUMP which are connected to a plurality of drain terminals DTM, which are, in turn, connected to a display region of the liquid crystal display panel. The BUMPS which are provided to at the other long side of the drive circuit chip IC and are disposed below the drain terminals DTM are dummy bumps.

Although the display region, which is formed by arranging the pixels in a matrix array on the main surface of the insulation substrate, is omitted in FIG. 1, the drive circuit chip IC shown in FIG. 1 is mounted on the peripheral portion (the outside of the display region) on the main surface of the insulation substrate. One long side of the drive circuit chip IC faces the display region in an opposed manner and the other side of the drive circuit chip IC faces one side of the main surface of the insulation substrate. The above-mentioned drain terminals DTM shown in FIG. 1 and the other wiring lines LL, LLPI, which will be described later, extend to the outside from the inside of the mounting portion of the main surface of the insulation substrate on which the drive circuit chip IC is mounted. The mounting portion of the main surface of the insulation substrate faces a mounting surface of the drive circuit chip IC, which is mounted on the mounting portion in an opposed manner, while the drain terminals DTM and the wiring lines LL, LLPI, which are formed on the main surface of the insulation substrate, are electrically connected with a plurality of bumps (the respective bumps corresponding to the drain terminals DTM and the wiring lines LL, LLPI) which are formed on the mounting surface at respective portions which are covered with the drive circuit chip IC.

Here, the reason why the term "input/output bump" is given to the bump I/O-BUMP corresponding to the above-mentioned first bump, which features the present invention, lies in the fact that the respective bumps I/O-BUMP are used for inputting signals to the drive circuit chip IC, as well as for outputting signals from the drive circuit chip IC. Further, the wiring lines LL, which are connected to the bumps I/O-BUMP and are formed on the insulation substrate, are also described as an "input/output wiring line".

The power source lines LLPI of the flexible printed circuit board FPC2 are thermo-compression-bonded to the power source input bumps P-BUMP through an anisotropic conductive film. The first input/output bumps I/O-BUMP are alternately arranged with respect to straight lines parallel to the short-side end periphery of the drive circuit chip IC. The input/output wiring lines LL, which are formed on the insulation substrate have one end thereof which is passed and extended to the inside of the mounting portion (the portion which is covered with the drive circuit chip IC) of the main surface of the insulation substrate from the outside of the mounting portion. To the respective (terminals of) input/output wiring lines LL which extend to the inside of the mounting portion, there is a terminal portion which is connected to one of the input/output bumps I/O-BUMP, which are formed on a mounting surface of the drive circuit chip IC (hereinafter referred to as an input/output wiring line terminal portion). The wiring lines LL extend from the input/output wiring line terminal portion, which is formed, thereon to the outside of the mounting portion of the insulation substrate main surface.

As shown in FIG. 1, at the right side and the left side of the drive circuit chip IC, the input/output bumps I/O-BUMP which are formed on the mounting surface are arranged along one side (short side) of the drive circuit chip IC, wherein alternate input/output bumps I/O-BUMP are arranged close to one side of the drive circuit chip IC. Accordingly, along the respective right and left ends of the drive circuit chip IC, the input/output bumps I/O-BUMP are arranged alternately in a staggered pattern. Corresponding to such an arrangement of the input/output bumps I/O-BUMP, terminal portions of the input/output wiring lines LL, which are formed on the mounting portion of the main surface of the insulation substrate, are also alternately arranged in a staggered pattern along respective ends at the right side and the left side of the mounting portion. Accordingly, the respective input/output wiring lines LL are shown in FIG. 1 such that the input/output wiring lines LL are pulled out from the input/output bumps I/O-BUMP corresponding to these input/output wiring lines LL to one end of the mounting portion (for example, the portion which is closest to the terminal portions of the input/output wiring lines LL) and the outside thereof.

The wiring lines LL, which are arranged at the left side in FIG. 1, are thermo-compression bonded to the first input/output bumps I/O-BUMP, which are arranged in parallel along the left-side short side of the drive circuit chip IC, or to the second input/output bumps A-BUMP, which are arranged close to the first input/output bumps I/O-BUMP and the left short side of the drive circuit chip IC through an anisotropic conductive film. In the same manner, the wiring lines LL which are arranged at the right side in FIG. 1 are thermo-compression bonded to the first input/output bumps I/O-BUMP, which are arranged in parallel along the right-side short side of the drive circuit chip IC, or to the second input/output bumps A-BUMP, which are arranged close to the first input/output bumps I/O-BUMP and the right short side of the drive circuit chip IC through an anisotropic conductive film. The first input/output bumps I/O-BUMP which are arranged at the left side of the drive circuit chip IC, the wiring lines LL corresponding to the first input/output bumps I/O-BUMP, the second input/output bumps I/O-BUMP which are arranged at the right side of the wiring line LL and the wiring lines LL which correspond to the second input/output bumps I/O-BUMP are collectively bonded in the thermo compression bonding step which is performed once by bringing a thermo compression bonding head to an upper surface of the drive circuit chip IC.

Signals and voltages which constitute display signals, which are inputted to the drive circuit chip IC from the input/output wiring lines LL at the left side formed on the insulation substrate, are processed by the drive circuit chip IC and are outputted to the drain terminals DTM from the data output bumps D-BUMP. Signals and voltages which constitute display signals, which are processed in the next drive circuit chip, are outputted to the right-side input/output wiring lines LL from the drive circuit chip IC and are inputted to the next drive circuit chip IC.

Figure 2B:
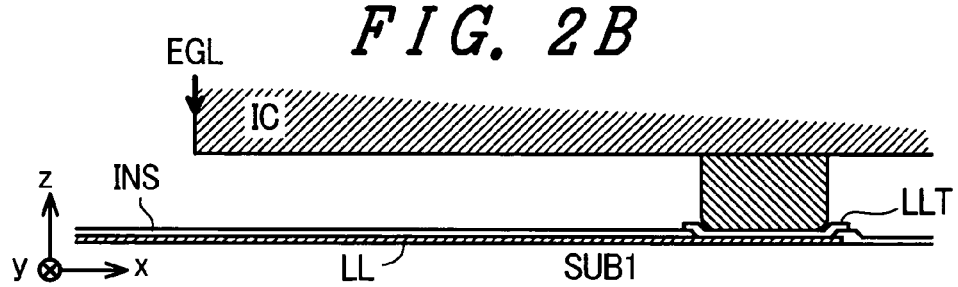
Figure 2C:
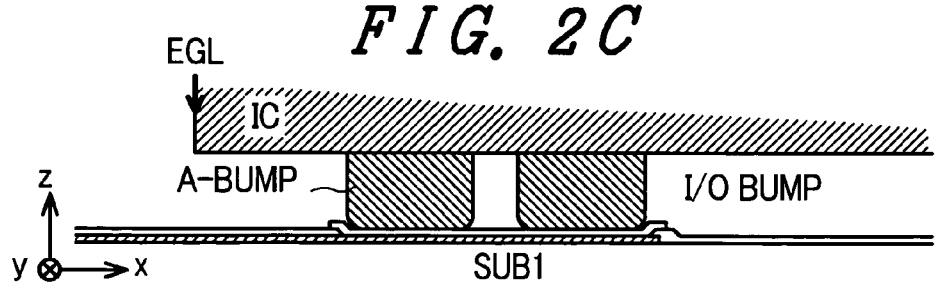
Figure 2D:
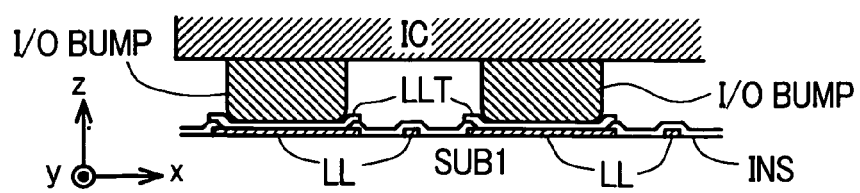

FIG. 2A is a partially enlarged plan view showing the constitution of the input/output wiring lines LL at the left-side short side and the first input/output bumps and the second input/output bumps which are provided to the drive circuit chip IC shown in FIG. 1. A line EGL in FIG. 2A indicates a chip end of the drive circuit chip IC (one side of the mounting surface of the above-mentioned drive circuit chip), and the right side from the chip end EGL on the main surface of the insulation substrate which faces the chip end EGL constitutes the above-mentioned "mounting portion". FIG. 2B shows a cross-section taken along a line b-b' in FIG. 2A, FIG. 2C shows a cross-section taken along a line c-c' in FIG. 2A, and FIG. 2D shows a cross-section taken along a line d-d' in FIG. 2A. In FIGS. 2A-2D and as well as FIG. 3, FIG. 4 and FIGS. 14A-14B, which will be referred to later, to clarify the arrangement relationship of the insulation substrate SUB1 and the drive circuit chip IC shown in the respective drawings, the rectangular coordinates consisting of three axes x, y, z are shown. In FIG. 1, the x direction indicates the direction extending from the left side to the right side of the drive circuit chip IC, the y direction indicates the direction extending from the lower end to the upper end of the drive circuit chip IC, and the z direction indicates the direction that the drive circuit chip IC is overlapped to the main surface of the insulation substrate (the thickness direction of the insulation substrate SUB1).

The input/output wiring lines LL which are formed on the insulation substrate are made of a metal or alloy and are covered with an insulation film INS made of $SiO_2$ (silicon oxide) or $SiN_x$ (silicon nitride). These input/output wiring lines LL terminate at the above-mentioned mounting portion which faces the mounting surface of the drive circuit chip IC (the portion of the main surface of the insulation substrate). Openings OPN (indicated by a dotted line in FIG. 2A) which expose terminal portions (or the vicinity thereof of the input/output wiring lines LL are formed in the insulation film INS, wherein terminal portions LLT (also referred to as LCD terminals hereinafter) are formed by conductive films which are brought into contact with input/output wiring lines LL and extend to an upper surface of the insulation film INS at these openings. In FIG. 2A, the planer shape of the terminal portion LLT is indicated by a broken line. The conductive film which constitutes the terminal portion LLT may be preferably formed of an oxide having a conductivity, such as corrosion-resistant ITO (Indium-Tin-Oxide), IZO (Indium-Zinc-Oxide) or the like.

As can be clearly understood by reference to FIG. 2A, FIG. 2B and FIG. 2C mutually, the terminal portions LLT are alternately spaced away from one end of the mounting portion of the main surface of the insulation substrate (the portion facing the chip end EGL), as shown in FIG. 2B, and they approach one end of the mounting portion alternately along the parallel-mounting portion, as shown in FIG. 2C. The positions of the input/output bumps I/O-BUMP on the mounting portion of the drive circuit chip are also spaced away from the chip end EGL, as shown in FIG. 2B, or they approach the chip end EGL alternately along the parallel mounting direction, as shown in FIG. 2C. The wiring lines LL (see FIG. 2B) which are connected to the terminal portions LLT remote from one end (chip end EGL) of the mounting portion have the width thereof reduced to obviate mutual short circuiting or electric interference (generated between signals transmitted to respective components) between the wiring lines LL (see FIG. 2B) which are connected to the terminal portions LLT arranged away from one end of the mounting portion (chip end EGL) and the wiring lines LL which are arranged close to the wiring lines LL (connected to the terminal portions LLT formed in the vicinity of one end of the mounting portion, see FIG. 2C).

Here, the "plurality of bumps" referred to previously as the structure 1, which features the display device according to the present invention, correspond to the input/output bumps I/O-BUMP in this embodiment, and the first bumps which belong to "the plurality of bumps" correspond to a group of the input/output bumps I/O-BUMP which are seen along the c-c' line in FIG. 2A. Here, the input/output bumps I/O-BUMP which are seen along the b-b' line in FIG. 2A correspond to one of the other groups of the above-mentioned plurality of bumps besides the above-mentioned first bumps.

On the mounting surface of the drive circuit chip IC, the input/output bumps I/O-BUMP are formed as bumps which are respectively connected with the above-mentioned LCD terminals LLT. In this embodiment, at positions close to the chip ends EGL of the input/output bumps I/O-BUMP, bumps (auxiliary bumps) are additionally provided at portions which face the input/output wiring lines LL having the LCD terminals LLT. These additional bumps are referred to as the second input/output bumps A-BUMP and the bumps which are provided to the end portions of the input/output wiring lines LL are referred to as the first input/output bumps I/O-BUMP. The first input/output bumps I/O-BUMP have a square shape and the size thereof is 60 μm×60 μm.

The width $y_2$ (a length along the y direction) of the input/output terminals LL is approximately 30 μm, the width $y_1$ (a length along the y direction) and the length $x_2$ (a length along the x direction) of the LCD terminals LLT are respectively 60 μm+α and the center-to-center distance y (Int) (a length along the y direction) in the direction parallel to the chip terminals EGL of the LCD terminals LLT is 55 μm. Here, the above-mentioned term "+α" means that the width of the LCD terminals LLT is slightly larger than the width of the first input/output bumps I/O-BUMP. Further, the distance x (Int) between a pair of neighboring first input/output bumps I/O-BUMP along the direction (y direction) parallel to the chip end EGL and along the direction (x direction) perpendicular to the chip end EGL is 25 μm. These sizes are described merely as an example. The sizes which are described hereinafter are also examples in the same manner.

The length (the above-mentioned $y_2$) of the side of the second input/output bump A-BUMP in the direction parallel to the chip end EGL is set to 30 μm and, hence, is substantially equal to the width of the input/output wiring lines LL. Further, the length $x_2$ (a length along the x direction) of the second input/output bump A-BUMP in the direction parallel to the longitudinal direction of the input/output wiring lines LL is set to 60 μm, which is equal to the length of the first input/output bumps I/O-BUMP. Further, the length $x_d$ of a gap (distance) which is formed between the first input/output bump I/O-BUMP and the second input/output bump A-BUMP spaced apart in the x direction is 20 µm and, hence, is shorter than the length ($x_1$) in the x direction of the first input/output bumps I/O-BUMP. It is desirable that the second input/output bump A-BUMP is electrically connected with the first input/output bump I/O-BUMP which is arranged close to the second input/output bump A-BUMP along the x direction. In this embodiment, the second input/output bump A-BUMP is electrically connected with the first input/output bump I/O-BUMP in the inside of the drive circuit chip IC. The reason why the bump A-BUMP is referred to as the "second input/output bump" is that the bump A-BUMP is brought into contact with the terminal portion LLT, as shown in FIG. 2C, and is made conductive with the first input/output bumps I/O-BUMP shown in FIG. 2C, thus contributing to the transfer of signals between the wiring lines LL which are connected with terminal portions LLT and the drive circuit chip IC. The second input/output bump A-BUMP corresponds to the above-mentioned "second bump" which was mentioned previously as the structure 1, which features the display device according to the present invention.

As in the case of this embodiment, by providing the second input/output bump A-BUMP to one end side of the first input/output bump I/O-BUMP which is connected to the terminal portion LLT arranged close to one end of the mounting portion of the main surface of the insulation substrate, (1) even when the atmosphere (the environment) is changed, the compression bonding strength between the first input/output bump I/O-BUMP and the wiring lines of the insulation substrate (the input/output wiring lines LL, the LCD terminal LLT) can be maintained. Due to this advantage (1), (2) the resistance of the connecting portion between the first input/output bump I/O-BUMP and the LCD terminal LLT can be lowered. Further, by allowing the second input/output bump A-BUMP to have the same potential as the first input/output bumps I/O-BUMP (see FIG. 2C) arranged close to the second input/output bump A-BUMP, (3) the probability that distortion is generated in the waveform of the signals (drive signals) transmitted through the wiring lines LL can be suppressed.

Figure 14A:
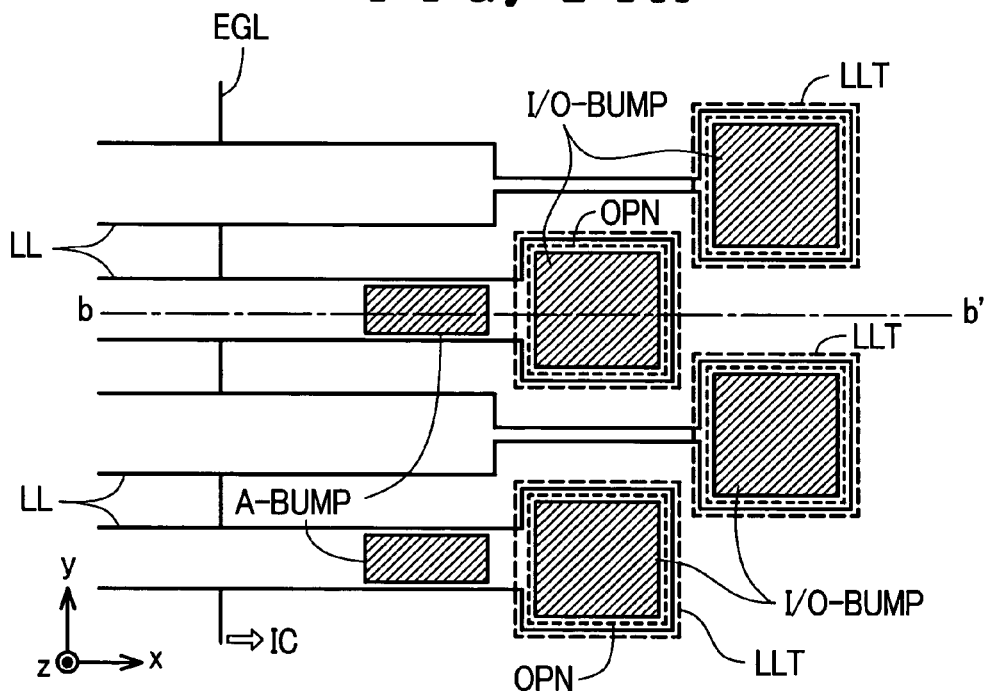
FIG. 14A is a plan view and FIG. 14B is a cross-sectional view taken along b-b' in FIG. 14A showing the structure which represents a modification of the embodiment 1 of the present invention in a state in which the left side of a drive circuit chip mounted on a main surface of an insulation substrate in FIG. 1 is partially enlarged.
Figure 14B:
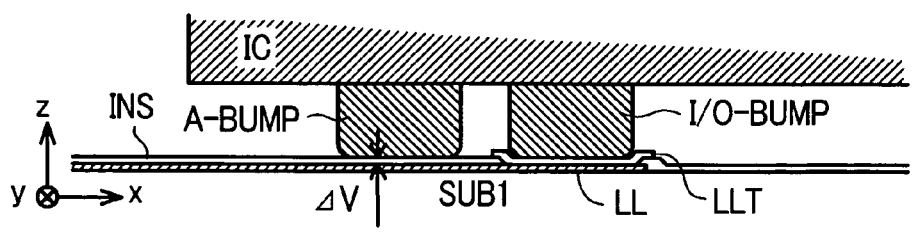

On the other hand, the planar structure based on one variation of this embodiment is shown in FIG. 14A. Further, the cross-sectional structure taken along a line b-b' indicated in FIG. 14A is shown in FIG. 14B. The cross-sectional structure in FIG. 14B shows, in the same manner as FIG. 2C, the first input/output bump I/O-BUMP which corresponds to the "first bump" and the second input/output bump A-BUMP which corresponds to the "second bump" of the display device according to the present invention. However, in contrast to the "second input/output bump A-BUMP" shown in FIG. 2C, the latter is electrically separated from the wiring lines LL which face the latter due to an insulation film INS. Accordingly, the bump A-BUMP shown in FIG. 14B does not constitute the "second input/output bump A-BUMP". Also with respect to one modification of this embodiment shown in FIGS. 14A and 14B, the bump A-BUMP and the first input/output bump I/O-BUMP (see FIG. 14B), which is arranged close to the bump A-BUMP, are set to have the same potential. Accordingly, (3') the possibility that a portion of the wiring line LL which faces the bump A-BUMP is subject to electrolytic corrosion due to a potential difference generated between them and is fused can be eliminated. Accordingly, there is no possibility that the width of the wiring line LL will be locally narrowed due to unpredicted electrolytic corrosion, whereby the elevation of the electric resistance can be also suppressed.

In both the display device to which this embodiment is applied and the display device to which the modification of this embodiment is applied, the connection resistance between one group of bumps I/O-BUMP formed on the mounting surface of the drive circuit chip IC arranged at the chip end EGL side and the terminal portions on the main surface of the insulation substrate corresponding to the respective bumps can be held at a low value in a stable manner, and, hence, the generation of a defective display can be prevented and images of high quality can be displayed.

EMBODIMENT 2

Figure 3:
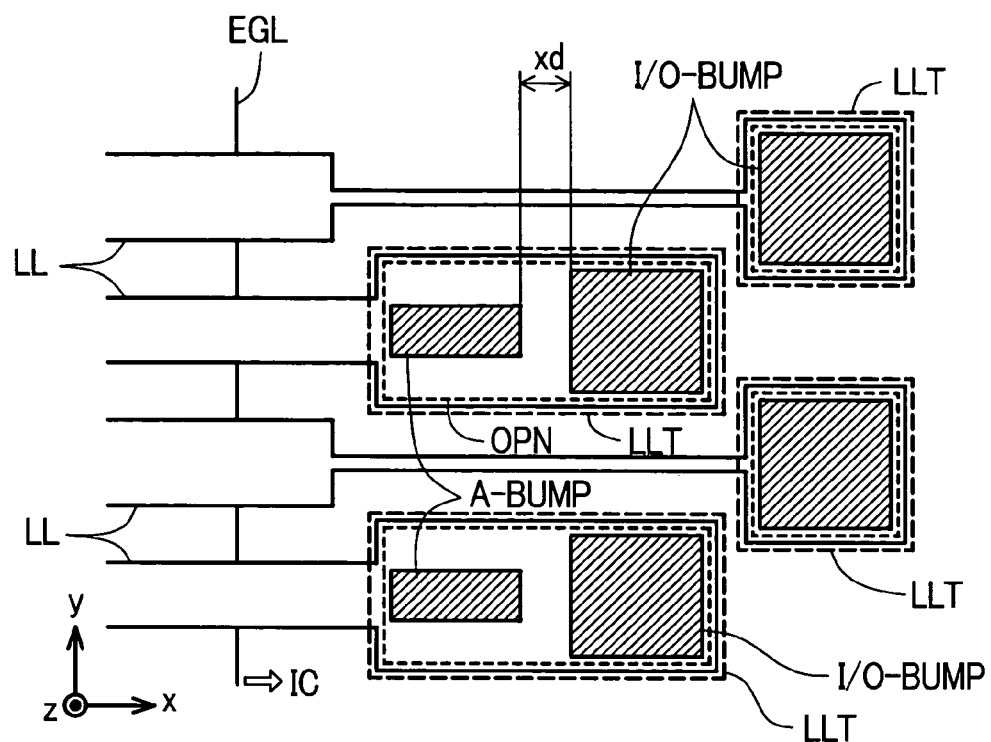
FIG. 3 is a plan view showing the planar structure which features an embodiment 2 of the present invention in a state in which the left side of a drive circuit chip mounted on a main surface of an insulation substrate in FIG. 1 is partially enlarged.

FIG. 3 is a partially enlarged plan view showing the constitution of the input/output wiring lines LL at the left short side and the first input/output bump and the second input/output bump provided to the drive circuit chip IC. The line EGL shown in FIG. 3 indicates a chip end of the drive circuit chip IC in the same manner as FIG. 2A. In this embodiment, out of the LCD terminals LLT which are alternately arranged, the LCD terminals LLT of the input/output wiring lines LL close to the chip end EGL side of the drive circuit chip IC are enlarged toward the chip end EGL side of the drive circuit chip IC. The width of the LCD terminal LLT in the direction parallel to the chip end EGL is set to a size (a size to cover, the term used in this meaning hereinafter) which includes first input/output bumps I/O-BUMP, wherein the length in the direction perpendicular to the chip end EGL is a size which includes the first input/output bumps I/O-BUMP and the second input/output bump A-BUMP.

Then, on the mounting surface of the drive circuit chip IC, the second input/output bump A-BUMP is added at the chip end EGL side of the first input/output bumps I/O-BUMP. A gap of 20 µm is formed between the first input/output bumps I/O-BUMP and the second input/output bump A-BUMP. The enlarged LCD terminal LLT, arranged close to the chip end EGL side of the drive circuit chip IC out of the LCD terminals LLT which are arranged alternately, has a size which includes the first input/output bumps I/O-BUMP and the added second input/output bump A-BUMP. The width of the input/output wiring lines LL which is arranged close to the input/output wiring lines LL having the enlarged LCD terminal LLT is formed to be narrow to prevent mutual short circuiting. The other features of this embodiment are substantially equal to the corresponding constitutions of the embodiment 1.

According to this embodiment, the second input/output bump A-BUMP is additionally provided to the drive circuit chip IC such that the second input/output bump A-BUMP is arranged closer to the chip end side of the drive circuit chip IC (that is, peripheral side of the drive circuit chip IC) than the existing first input/output bumps I/O-BUMP. Further, corresponding to the above-described constitution, the LCD terminals LLT of the input/output wiring lines LL which are formed on the insulation substrate are configured to have a shape which covers the first input/output bumps I/O-BUMP and the second input/output bump A-BUMP. Due to such a constitution, the previously-mentioned residual stress is reduced, and, hence, it is possible to provide a display device of high image quality in which the generation of a defective display can be reduced in the same manner as the embodiment 1.

Further, in this embodiment, the area of the terminal portions LLT formed on the main surface of the insulation substrate which are respectively connected to one group of bumps I/O-BUMP of the drive circuit chip IC, which are arranged at the chip end EGL side, is set to a size which can cope with both the bump I/O-BUMP of one group and the bump I/O-BUMP of another group arranged close to the chip end EGL side, and, hence, (4) the accuracy of positioning between the bumps I/O-BUMP and the terminal portions LLT at the time of mounting the drive circuit chip IC on the main surface of the insulation substrate can be enhanced. Further, (5) it is possible to ensure the desired tolerance in the electric connection between the bumps I/O-BUMP and the terminals LLT (wiring lines at the insulation substrate side).

EMBODIMENT 3

Figure 4:
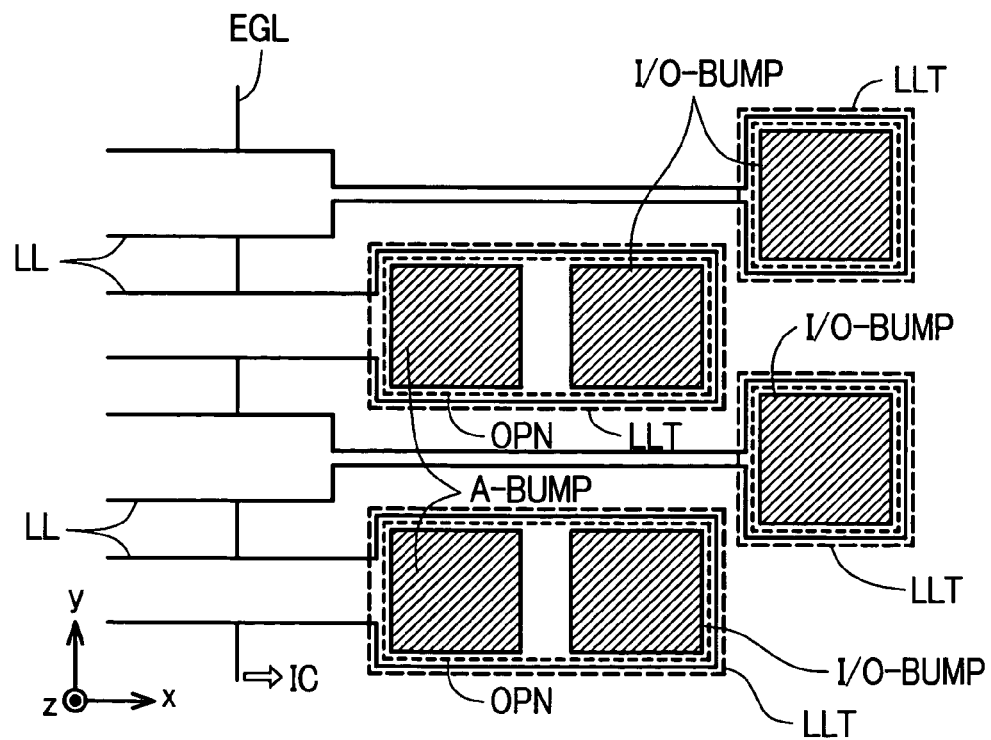
FIG. 4 is a plan view showing the planar structure which features an embodiment 3 of the present invention in a state in which the left side of a drive circuit chip mounted on a main surface of an insulation substrate in FIG. 1 is partially enlarged.

FIG. 4 is a partially enlarged plan view showing the constitution of the input/output wiring lines LL at the left short side in FIG. 1 and the first input/output bump and the second input/output bump provided to the drive circuit chip IC. This embodiment is characterized in that the second input/output bump A'-BUMP in the embodiment 2 has the same shape as the first input/output bump A-BUMP. In this embodiment, out of the LCD terminals LLT which are alternately arranged, the LCD terminals LLT of the input/output wiring lines LL close to the chip end EGL side of the drive circuit chip IC are enlarged toward the chip end EGL side of the drive circuit chip IC and are connected such that the LCD terminal LLT includes the first input/output bump I/O-BUMP and the second input/output bump A'-BUMP. The other features of this embodiment are substantially equal to the corresponding constitutions of the embodiment 2. Also, according to this embodiment, the previously-mentioned residual stress is reduced, and, hence, it is possible to provide a display device of high image quality in which the generation of a defective display can be reduced in the same manner as the embodiment 1.

Here, the present invention may include suitable combinations of the above-mentioned respective embodiments. Further, although all of the first input/output bumps and the second input/output bumps have a rectangular shape (a square shape, a rectangular shape) in the respective embodiments, the bumps may be formed in a circular shape or a polygonal shape in place of these shapes. Further, at the time of adhering the drive circuit chip to the LCD terminal of the insulation substrate by way of the anisotropic conductive film, by also inserting the anisotropic conductive film between the first input/output bumps and the second input/output bumps, the adhesive area can be increased. Due to such a constitution, the stress which is applied to the anisotropic conductive film used for bonding the first input/output bumps I/O-BUMP to the corresponding terminal portion LLT can be attenuated.

Next, a specific example in which the present invention is applied to the mounting of the drive circuit chip to an actual display device will be explained.

Figure 5:
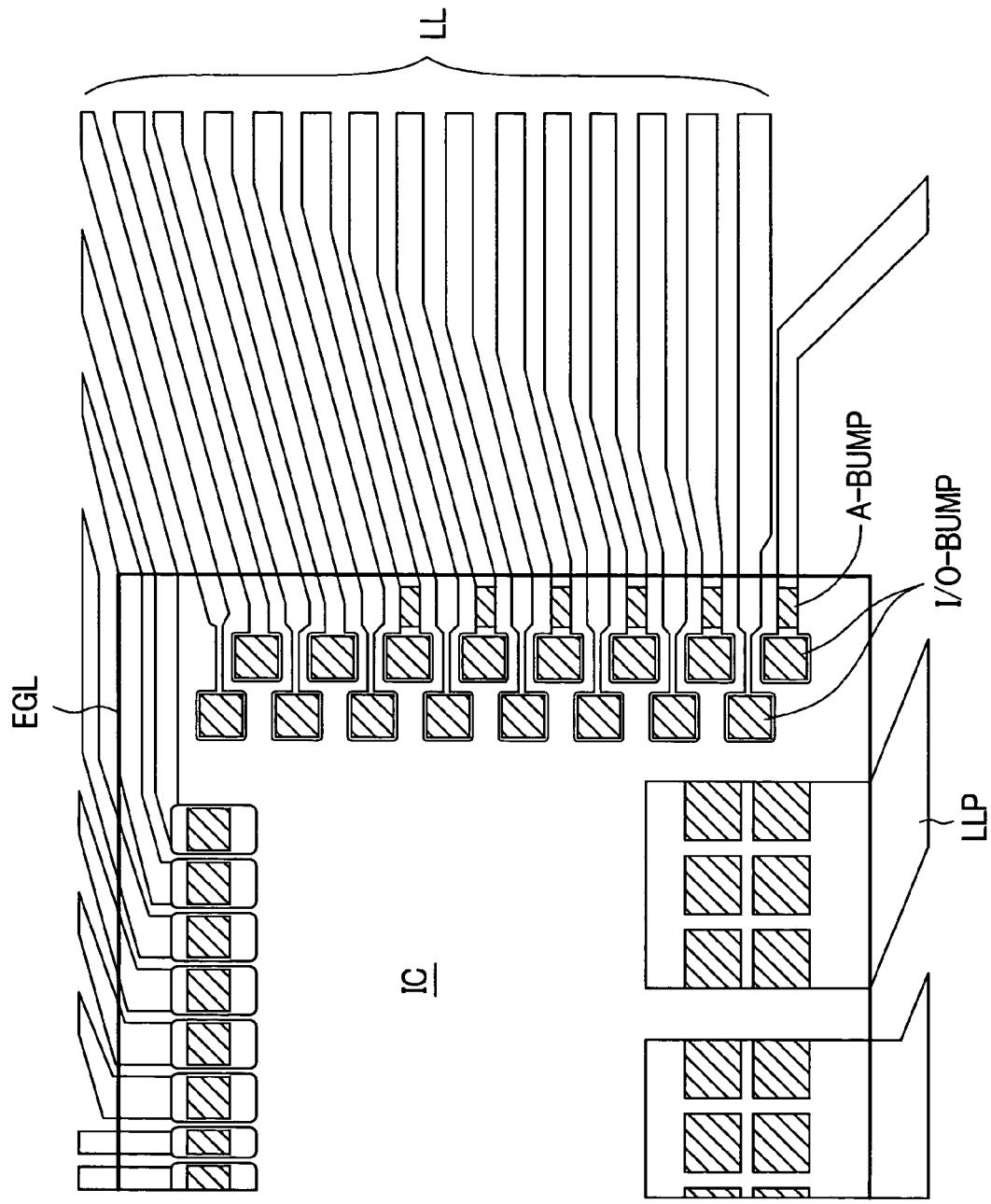
FIG. 5 is a plan view showing an example of a principal part of one mounting arrangement of input/output wiring lines corresponding to a right short side of the drive circuit chip shown in FIG. 1 and the drive circuit chip in an enlarged manner.

FIG. 5 is a plan view which shows an enlarged essential part of one embodiment of the input/output wiring lines corresponding to the right short side of the drive circuit chip shown in FIG. 1 and the drive circuit chip. In the specific example shown in FIG. 5, the input/output wiring lines LL, which are formed on the insulation substrate, have the right upper portions thereof as seen in FIG. 5 inclined with respect to the short side. The drive circuit chip IC includes the first input/output bumps I/O-BUMP and the second input/output bump A-BUMP, which were described in conjunction with FIGS. 2A-2D. However, in the right upper portions as seen in FIG. 5 where input/output wiring lines LL are inclined (although not shown in the drawing, the left upper portions having the same constitution, here, only the right upper portion being explained), the input/output wiring lines LL are arranged close to each other. In a region where the wiring lines LL extend obliquely with respect to the chip end EGL of the drive circuit chip IC in this manner, when the second input/output bump A-BUMP or an equivalent (being electrically insulated from one wiring line) faces one of the wiring lines LL, the second input/output bump A-BUMP or the equivalent may approach the other wiring line which is arranged close to one wiring line LL or may face the second input/output bump A-BUMP or the equivalent to one wiring line. Accordingly, even when the neighboring other wiring line is covered with the insulation film, and, hence is electrically separated from the second input/output bump A-BUMP or the equivalent, a potential difference is generated between these elements by way of the insulation film, and there exists the possibility that the neighboring other wiring line may fuse and be discharged due to electrolytic corrosion. Accordingly, the second input/output bump A-BUMP is not formed on the right upper portion in FIG. 5.

Figure 6:
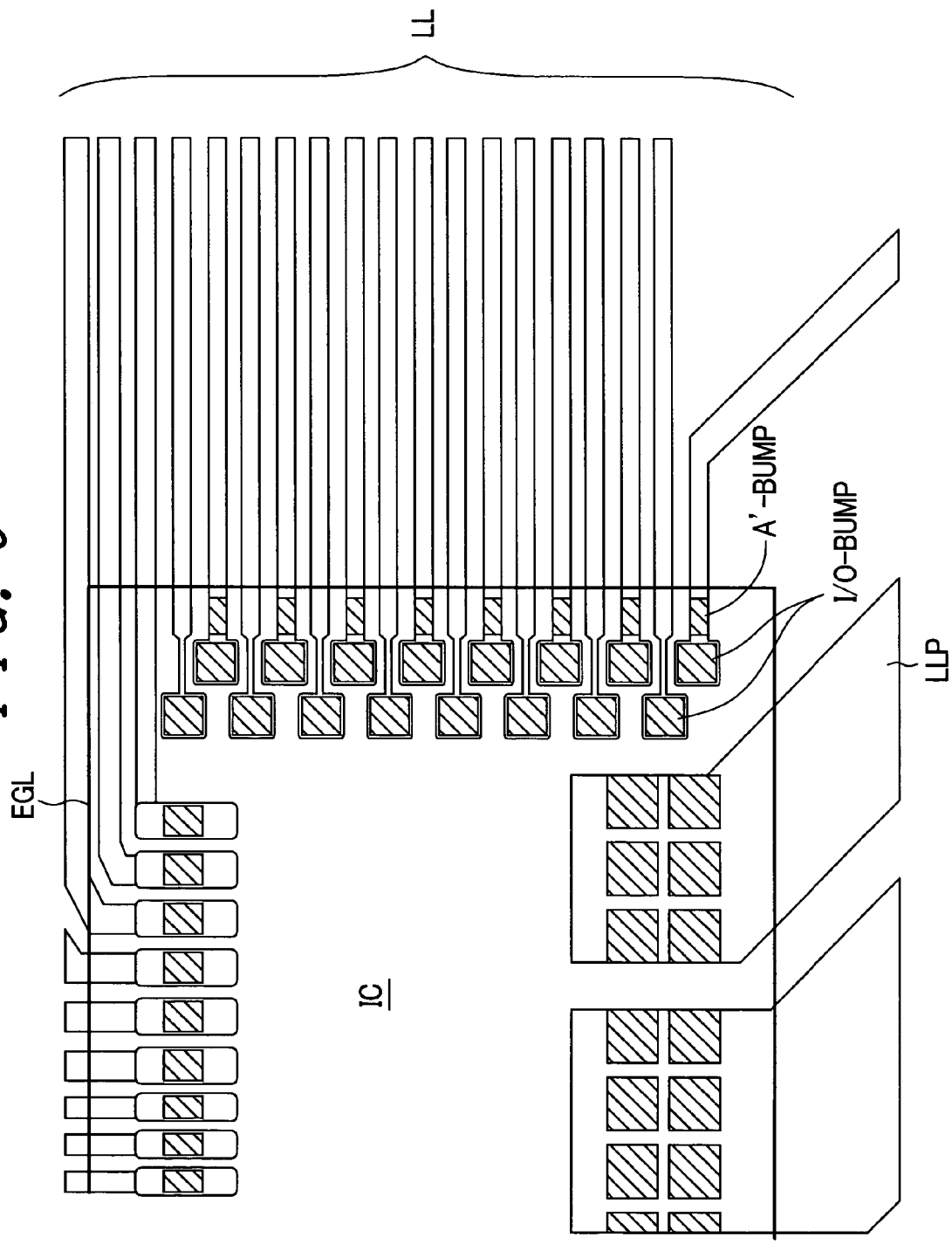
FIG. 6 is a plan view showing an example of a principal part of another mounting arrangement of input/output wiring lines corresponding to a right short side of the drive circuit chip shown in FIG. 1 and the drive circuit chip in an enlarged manner.

FIG. 6 is an enlarged plan view which shows a part of another embodiment of the input/output wiring lines corresponding to the right short side of the drive circuit chip shown in FIG. 1 and the drive circuit chip. In the specific example shown in FIG. 6, the input/output wiring lines LL which are formed on the insulation substrate extend perpendicularly to the short side of the drive circuit chip IC. With respect to the drive circuit chip IC, FIG. 6 shows a case in which the drive circuit chip IC having the first input/output bumps I/O-BUMP and the second input/output bump A-BUMP of the embodiment shown in FIGS. 2A-2D is mounted and a case in which the drive circuit chip IC having the first input/output bumps I/O-BUMP and the second input/output bump A'-BUMP of the embodiment shown in FIG. 4 is mounted. Here, to distinguish the second input/output bump A'-BUMP from the second input/output bump A-BUMP, hatching is not provided to a rectangular pattern corresponding to the second input/output bump A'-BUMP.

In mounting the drive circuit chip IC having the first input/output bumps I/O-BUMP and the second input/output bump A-BUMP or the drive circuit chip IC having the first input/output bumps I/O-BUMP and the second input/output bump A'-BUMP on the insulation substrate having the input/output wiring lines LL shown in FIG. 6, it is possible to provide the second input/output bump A-BUMP or the second input/output bump A'-BUMP to all of the LCD terminals LLT that are arranged close to the chip end of the LCD terminals LLT, which are arranged alternately along the short side of the drive circuit chip IC.

Figure 7:
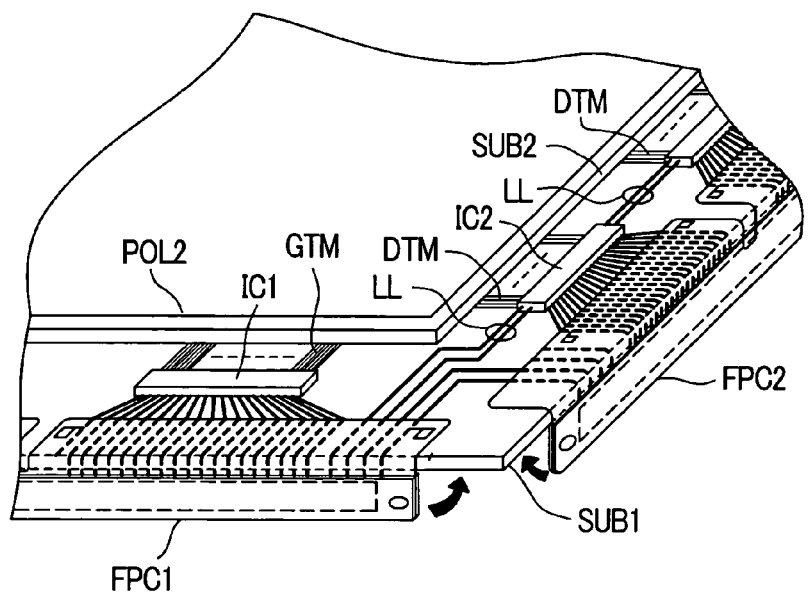
FIG. 7 is a perspective view showing the mounting state of respective members including the drive circuit chip on the insulation substrate when the present invention is applied to a liquid crystal display device.

FIG. 7 is a perspective view showing the mounting state of respective members, including the drive circuit chip IC, on the insulation substrate when the present invention is applied to a liquid crystal display device. In FIG. 7, a liquid crystal display panel is constituted by sealing a liquid crystal layer in a gap defined by laminating a first substrate SUB1, which constitutes one insulation substrate, and a second substrate SUB2, which constitutes a second insulation substrate. In this example, a display region, on which a large number of pixels having thin film transistors are arranged in a matrix array, is formed on an inner surface of the first substrate SUB1, while multi-color color filters are formed on an inner surface of the second substrate SUB2, which faces the above-mentioned display region in an opposed manner. Further, polarizers POL1, POL2 are respectively stacked on respective surfaces of the first substrate SUB1 and the second substrate SUB2 (only the polarizer POL2 being shown in FIG. 7).

Reference symbols in FIG. 7 which are the same as reference symbols used in the drawings showing the above-mentioned embodiments and specific examples identify identical functional parts. The liquid crystal display device mounts a drive circuit chip IC1 for driving gate lines and a drive circuit chip IC2 for driving drain lines (corresponding to the above-mentioned drive circuit chip IC according to the present invention) on the first substrate SUB1, which is one of the insulation substrates which constitute the liquid crystal display panel using the COG method. Flexible printed circuit boards FPC1, FPC2 which communicate with an external circuit which is connected with these drive circuit chips IC1, IC2 are folded back to a back surface of the substrate SUB1 from an end periphery of the first substrate SUB1, as shown in a bold arrow mark in the drawing. Due to such a constitution, it is possible to largely narrow the picture frame of the liquid crystal panel.

To the drive circuit chip IC1 for driving the gate lines, scanning signals are applied from the flexible printed circuit board FPC1, which is connected with an external signal source (not shown in the drawing), while gate signals are supplied to gate lines GTM, which are pulled out from the display region. In response to the display data supplied to the thin film transistors, which are connected to the gate lines selected by scanning of the gate signals from the drive circuit chip IC2 for driving the drain line through the drain line DTM, corresponding pixels are turned on to display images.

Figure 8:
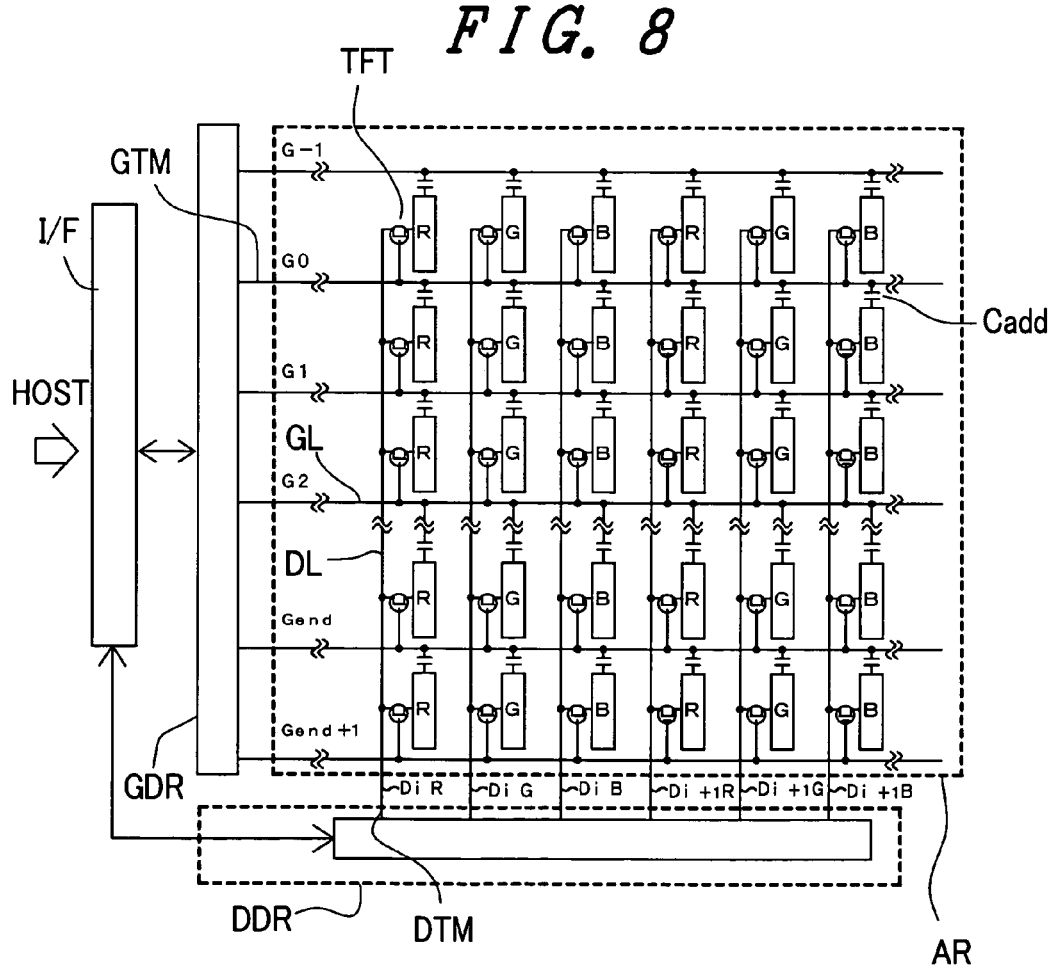
FIG. 8 is a schematic diagram showing an example of an equivalent circuit of the liquid crystal display device.

FIG. 8 is a schematic diagram showing an example of an equivalent circuit of the liquid crystal display device. At a lower side of the display region AR of the liquid crystal display panel, there is a video signal line drive circuit DDR, which is constituted of a plurality of drive circuit chips IC2 for driving drain lines. On the other hand, to the side-face side of the liquid crystal display device, there are a scanning signal line drive circuit GDR, which is constituted of a plurality of drive circuit chips IC1 for driving gate lines, and an interface printed circuit board I/F which mounts a controller part and a power source part thereon. Various signals and voltages from the interface substrate I/F are supplied to the scanning signal line drive circuit GDR and the video signal line drive circuit DDR and through the above-mentioned flexible printed circuit boards FPC1, FPC2.

The thin film transistor TFT, which constitutes the active element in each pixel, is arranged in the inside of a crossing region which is defined by two neighboring drain lines DL and two neighboring gate lines GL, and the drain electrodes and the gate electrodes thereof are respectively connected with the drain lines DL and the gate lines GL. Symbols GTM (G-1, G0, G1, G2, ... Gend, Gend+1) indicate gate-line lead lines, symbols DTM (DiR, DiG, DiB, ... Di+1R, Di+1G, Di+1B, ...) indicate drain-line lead lines, and symbol Cadd indicates a holding capacitance.

Figure 9:
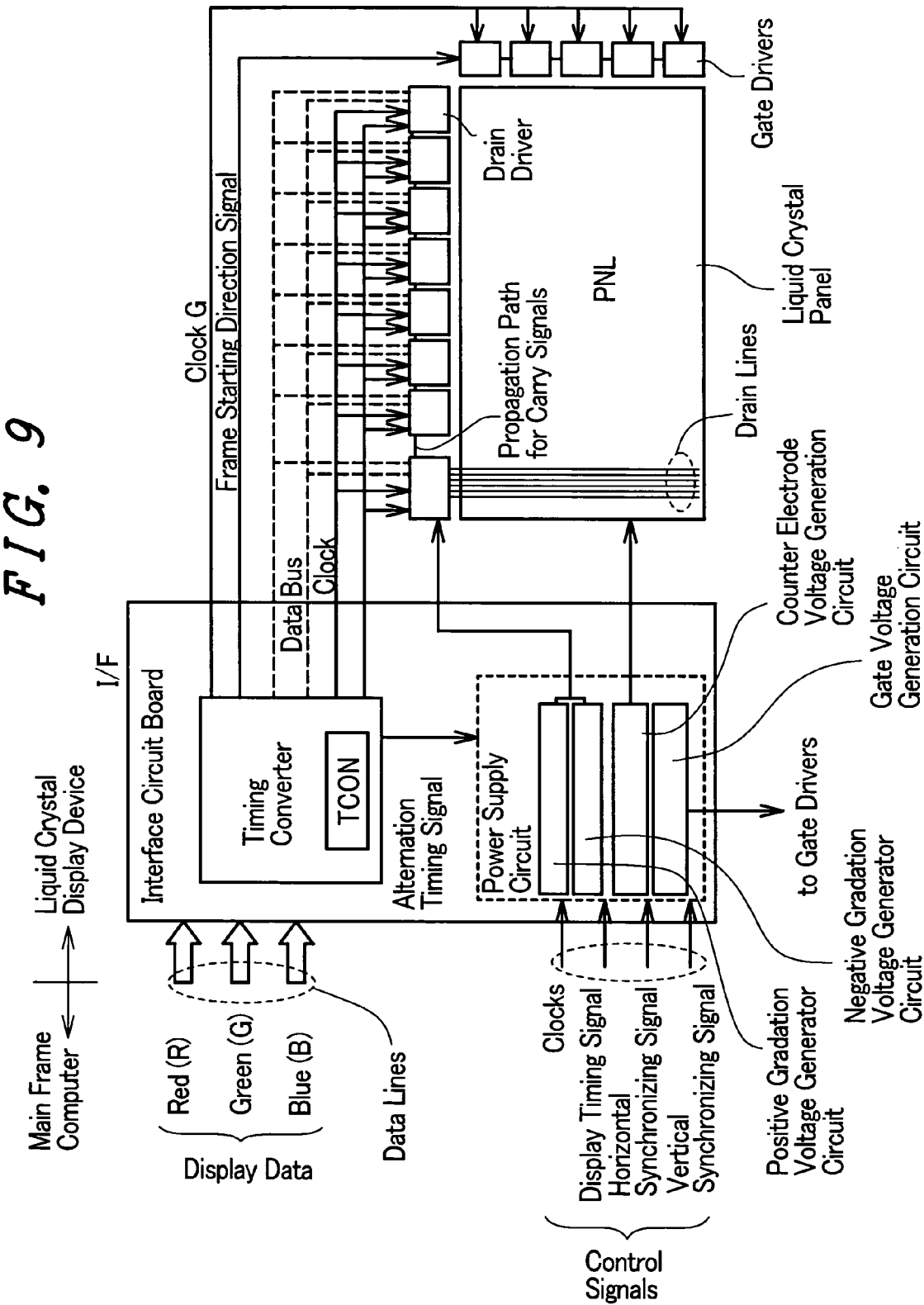
FIG. 9 is a block diagram showing an example of a drive circuit in an active matrix type liquid crystal display device.

FIG. 9 is a block diagram showing an example of the drive circuit in the active-matrix-type liquid crystal display device. The liquid crystal display device includes an interface substrate I/F that mounts an interface circuit, which applies pixel data, various kinds of clock signals, and various kinds of drive voltages to the liquid crystal panel PNL in response to control signals, including display signals and clock signals received from a main computer (HOST in FIG. 8).

The interface circuit I/F has a display control device which includes a timing converter TCON and a power source circuit, wherein the display control device outputs various signals, such as display data on a data bus which transmits the display data generated in response to display signals to the liquid crystal panel, a clock for the drive circuit chip for driving drain lines to receive the display data, a clock for the drive circuit chip for driving the drain lines to switch the liquid crystal drive signals, a frame starting command signal which drives a drive circuit chip for driving the drain line (described as the gate driver in FIG. 9) and a gate clock supplied to a liquid crystal display panel (described as the liquid crystal panel in FIG. 9) PNL.

Further, the power source circuit is constituted of a positive electrode gray scale voltage generation circuit, a negative electrode gray scale voltage generation circuit, a counter electrode voltage generation circuit and a gate voltage generation circuit. The interface substrate I/F, which receives the display signals and the control signals from the main computer, transfers data by one pixel unit, that is, transfers data for one pixel consisting of respective data of red (R), green (G) and blue (B) as a set within a unit time, to the drive circuit chips (drain drivers) for driving the drain lines.

The clock signal, which becomes the reference with respect to the unit time, is transmitted from the main computer HOST to the liquid crystal display device. To be more specific, for example, in a liquid crystal display device having 1024×768 pixels, a frequency of 65 MHz is usually used. The liquid crystal display panel PNL is constituted such that the drive circuit chips for driving the drain lines are arranged in the lateral direction using a display screen as the reference, the drive circuit chips for driving drain lines are connected to lead wiring lines (DTM) of the drain lines of the thin film transistors TFT, and voltages are supplied for driving the liquid circuit. Further, lead wiring lines (GTM) of the drive circuit chips for driving gate lines are connected to the gate lines and voltages are supplied to gates of the thin film transistors TFT for a fixed time (one horizontal operation time).

The timing converter TCON is constituted of a semiconductor chip, and it receives display signals and various kinds of control signals from the main computer HOST and outputs necessary display data and operation clocks to the drive circuit chips for driving drain lines and the drive circuit chips for driving gate lines in response to the display signals and various kinds of control signals. Here, in this example, the data lines for one pixel are 18 bits (6 bits for R, G, B, respectively).

In this embodiment, the transmission of signals from the main computer HOST to the timing converter TCON of the liquid crystal display device is performed in response to so-called LVDS, which are low voltage amplitude differential signals. From the timing converter TCON to the drive circuit chips for driving the drain lines, the transmission of signals is performed in response to signals at the COMS level. In this case, however, it is difficult to supply the pixel clock of 65 MHz, and, hence, the transmission of the display data is performed in synchronism with both rising and falling edges of clocks of 32.5 MHz.

To the drive circuit chip for driving the drain lines, pulses of a horizontal period are given in response to a horizontal synchronizing signal and a display timing signal, such that the voltage is supplied to the gate lines of the thin film transistors TFT for every one horizontal time. With respect to one frame time unit, a frame start command signal is also given in response to a vertical synchronizing signal so that the display is started from the first line.

The positive electrode gray scale voltage generation circuit and the negative electrode gray scale voltage generation circuit of the power source circuit, in order to prevent the same voltage from being applied to the same liquid crystal for a long time, generate a reference voltage for converting voltages which are applied to the liquid crystal every fixed period into an AC current. The actual alternating operation is performed by switching the positive gray scale voltage and the negative gray scale voltage within the drive circuit chip for driving the drain lines. Here, the alternation implies that, using the counter electrode voltage as a reference, the voltage which is applied to the drive circuit chip for driving the drain lines is changed to the positive voltage side/negative voltage side for every fixed time. Here, the cycle of alternation is set to one frame time unit.

By mounting the drive circuit chip on the insulation substrate (first substrate SUB1) of the liquid crystal display panel having such a constitution by way of the anisotropic conductive film using a COG method while providing the additional bumps described in conjunction with respective embodiments, it is possible to provide a high-quality display device which can disperse the residual stress attributed to thermo compression bonding of the drive circuit chip or thermo compression bonding of the flexible printed circuit board and which can stabilize the connection resistance, thus suppressing the generation of a defective display.

Figure 10:
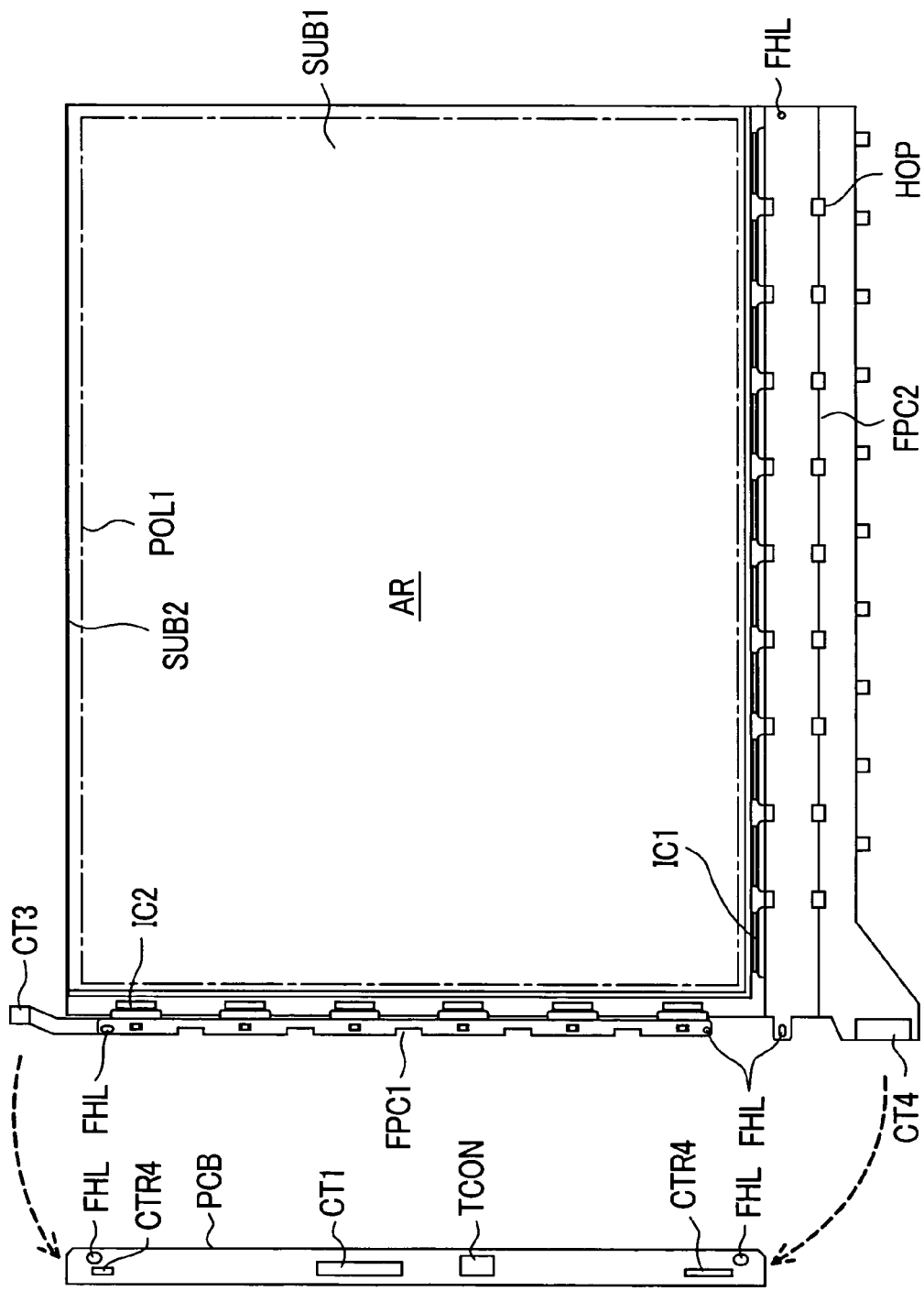
FIG. 10A is a plan view of a liquid crystal display panel in which a drive circuit chip provided with additional bumps is mounted according to the present invention and FIG. 10B is a side view showing the interface substrate.
Figure 11:
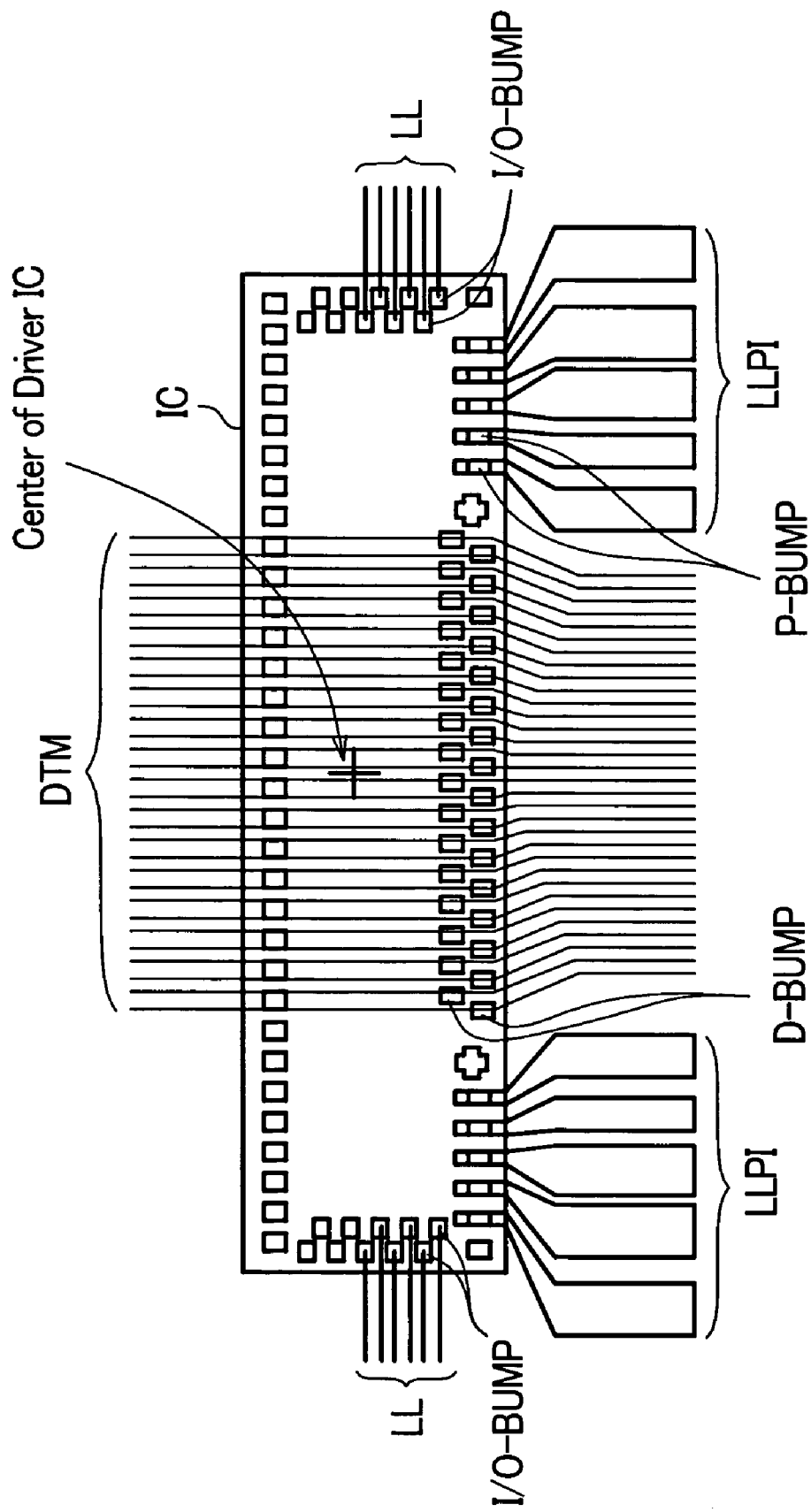
FIG. 11 is a plan view showing an example of the arrangement and structure around a drive circuit chip mounted on an end edge of one substrate of a liquid crystal display panel.
Figure 12:
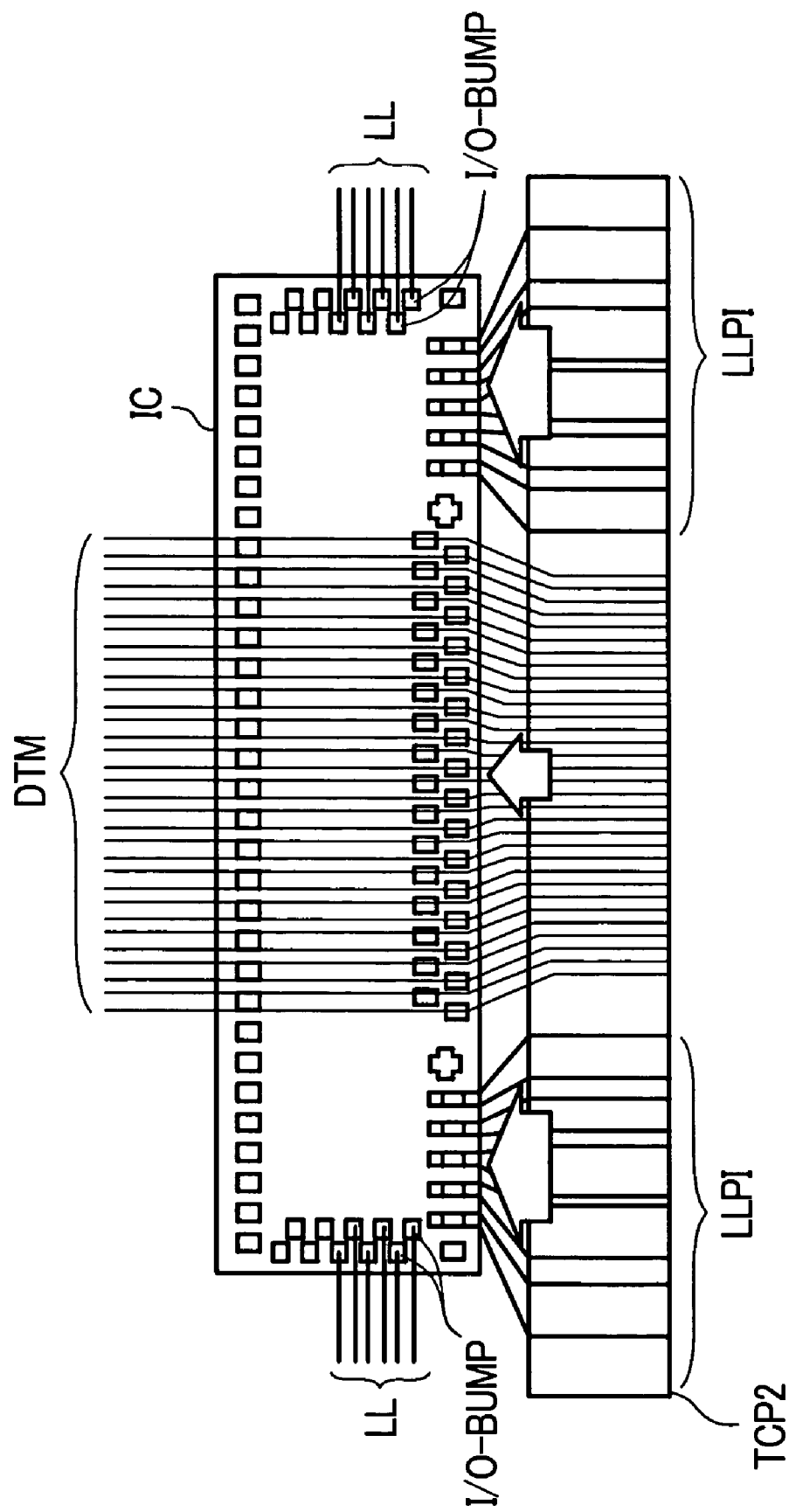
FIG. 12 is a plan view showing a state in which a flexible printed circuit board is mounted on a drive circuit power source input wiring lines shown in FIG. 11.
Figure 13:
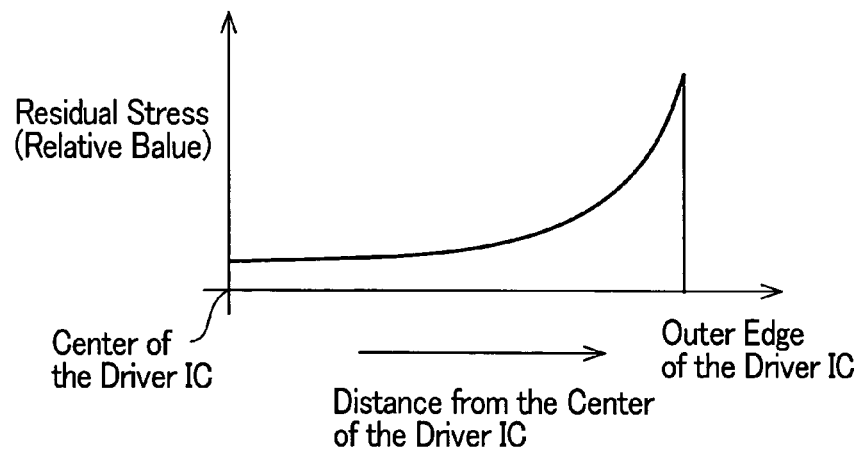
FIG. 13 is graph of a residual stress on a thermocompression bonded surface of a mounted drive circuit chip.

FIG. 10A is a plan view of the liquid crystal display panel according to the present invention on which the drive circuit chip which is provided with additional bumps is mounted. The liquid crystal display panel PNL is constituted by sealing a liquid crystal layer in a laminating gap defined between the first substrate SUB1, which constitutes an active matrix substrate, and the second substrate SUB2, which constitutes a color filter substrate and is generally provided with color filters.

The profile of the first substrate SUB1 is slightly larger than the profile of the second substrate SUB2, and the drive circuit chips (the drive circuit chip for driving gate lines IC1 and the drive circuit chip for driving drain lines IC2) are mounted around a portion which projects from the first substrate SUB1 by a flip chip mounting method. These respective drive circuit chips, which use thin film transistors as active elements, include the drive circuit chip for driving gate lines (gate driver) that are connected to the lead wiring lines of the gate lines of the thin film transistors and the drive circuit chip for driving drain lines (drain driver) which are connected to the lead wiring line of the drain line.

On these drive circuit chips, flexible printed circuit boards FPC1 and FPC2 are arranged for supplying various kinds of signals for display. The flexible printed circuit boards FPC1 and FPC2 are connected to the interface substrate PCB which is formed in the vicinity of the liquid crystal display panel. On the interface substrate PCB, various kinds of semiconductor circuit chips, such as the timing converter for converting the display signals received from the external signal sources, such as the main computer, into display signals for the liquid crystal display device or other electric circuit elements are mounted in the above-mentioned manner.

In FIG. 10A, on one edge of the first substrate SUB1 (lower edge, a longitudinal side in the drawing), a flexible printed circuit board PFC2 is mounted on the side for drive circuit chip for driving the drain lines. The flexible printed circuit board FPC2 is folded to a back side of the liquid crystal display panel PNL along the arrangement of the opening portion HOP thereof. Further, on the left edge (a left edge, a lateral side in the drawing), a flexible printed circuit board FPC1 is mounted on the side for drive circuit chip for driving gate lines. Further, connectors CT3 for the flexible printed circuit board FPC1 are connected with connecters CTR4, which are connected with the connector CTR3 of the interface printed circuit board PCB and the connector CT4 of the drain-line side flexible printed circuit board FPC2.

Further, on the interface substrate PCB, an interface connecter CT1 which connects signals from an external signal source, such as a host computer, a timing converter TCON or the like, is mounted. In this embodiment, although the LVDS method is adopted as the data transmission method, as described above, with respect to a receiver-side signal converter (LVDS-R) which is necessary in such a method, by adopting a method which integrates the receiver-side signal converter (LVDS-R) with the timing converter TCON using the same chip, the area for mounting the interface substrate can be reduced.

Here, on the back surface side (the surface of the first substrate SUB1) of the liquid crystal display panel PNL and on the display surface side (the surface of the second substrate SUB2) of the liquid crystal display panel PNL, the lower polarizer and the upper polarizer are stacked. In FIG. 10A, only the upper polarizer POL1 is shown. Further, in the inner side of the upper polarizer POL1, the display region AR is formed.

On the peripheries of the left side and the lower side of the first substrate SUB1, a large number of lead lines which supply the display data to the above-mentioned active elements and a large number of input wiring lines which connect various kinds of signals for display which are inputted from the outside by way of the flexible printed circuit boards FPC1 and FPC2 are formed. Further, as has been explained in connection with the above-mentioned embodiments, respective bumps of the above-mentioned drive circuit chips IC1 and IC2 are connected to the above-mentioned input wiring lines and output wiring lines by way of the anisotropic conductive film by the FCP mounting. In FIGS. 10A and 10B of the drawing, symbol HOP indicates frame ground pads and symbol FHL indicates a positioning hole.

What is claimed is:

1. A display device comprising:
   an insulation substrate;
   a display region which is formed by arranging a plurality of pixels on a main surface of the insulation substrate;
   at least one drive circuit element which is mounted on a peripheral portion of the main surface of the insulation substrate and supplies signals or electric power to the display region; and
   a plurality of wiring lines which are formed on the peripheral portion of the main surface and have terminal portions thereof which are connected to the drive circuit element respectively formed on a mounting portion of the main surface on which the drive circuit element is mounted and which respectively extend to the outside of the mounting portion of the main surface, wherein
   the terminal portions which are respectively provided to the plurality of wiring lines are arranged in parallel along one end of the mounting portion such that the plurality of terminal portions are arranged close to one end of the mounting portion every one other,
   a plurality of bumps which are connected to the respective terminal portions by an anisotropic conductive film are arranged in parallel on a mounting surface of the drive circuit element which faces the mounting portion of the main surface in an opposed manner along one side of the mounting surface which faces one end of the mounting portion in an opposed manner, first bumps which belong to the plurality of bumps and are respectively connected to a group of terminal portions which are provided close to one end of the mounting portion are arranged closer to one side of the mounting surface than the plurality of respective bumps other than the first bumps, and second bumps which are different from the plurality of bumps are formed on the mounting surface close to the first bumps at one side of the mounting surface.

2. A display device according to claim 1, wherein the second bumps assume the same potential as the first bumps which are arranged close to the second bumps.

3. A display device according to claim 2, wherein the plurality of wiring lines are covered with an insulation film, and the terminal portions are brought into contact with the wiring lines through openings which are formed on the insulation film and expose the respective lines and extend over the insulation film.

4. A display device according to claim 3, wherein the second bumps face the wiring lines which are connected with the first bumps arranged close to the second bumps by way of the insulation film and are spaced apart from the first bumps.

5. A display device according to claim 1, wherein one of the terminal portions which are connected to the first bumps has an area which allows the terminal portion to be connected with not only the first bump but also the second bump which is arranged close to the first pump.

6. A display device according to claim 5, wherein an area of one terminal portion which is connected to the first bump and the second bump which is arranged close to the first bump is set larger than an area of another terminal portion which is formed on another wiring line arranged close to one of the wiring lines which are electrically connected with the first bumps.

7. A display device according to claim 1, wherein the second bumps are arranged to face the wiring lines which are connected to the first bumps close to the second bumps and are spaced apart from the first bumps.

8. A display device comprising:
an insulation substrate;
a display region which is formed by arranging a plurality of pixels on a main surface of the insulation substrate;
at least one drive circuit element which is mounted on a peripheral portion of the main surface of the insulation substrate and supplies signals or electric power to the display region; and a plurality of wiring lines which are formed on the peripheral portion of the main surface and have terminal portions thereof which are connected to the drive circuit element respectively formed on a mounting portion of the main surface on which the drive circuit element is mounted and which respectively extend to the outside of the mounting portion of the main surface, wherein the terminal portions which are respectively provided to the plurality of wiring lines are arranged in parallel along one end of the mounting portion such that the plurality of terminal portions are arranged close to one end of the mounting portion every one other, a plurality of bumps which are connected to the respective terminal portions by an anisotropic conductive film are arranged in parallel on a mounting surface of the drive circuit element which faces the mounting portion of the main surface in an opposed manner along one side of the mounting surface which faces one end of the mounting portion in an opposed manner, a group of bumps out of the plurality of bumps which are respectively connected with a group of the terminal portions which are formed close to one end of the mounting portion is arranged closer to one side of the mounting surface than other groups of bumps, and one group of bumps is formed in a more extended manner on one side of the mounting surface than other groups of bumps.

9. A display device according to claim 8, wherein a length of one group of bumps extended along one side of the mounting surface is twice or more greater than a length of other groups of bumps extended along one side of the mounting surface.

10. A display device according to claim 8, wherein a plurality of drive circuit elements are mounted in parallel along one side of the main surface of the insulation substrate, and the plurality of wiring lines electrically connect the plurality of respective bumps which are respectively formed on the pair of neighboring drive circuit elements out of the plurality of drive circuit elements.

\* \* \* \* \*